United States Patent
Peng et al.

(10) Patent No.: US 11,037,981 B2
(45) Date of Patent: Jun. 15, 2021

(54) SEMICONDUCTOR DEVICE WITH MAGNETIC TUNNEL JUNCTIONS

(71) Applicant: Taiwan Semiconductor Manufacturing Company, Ltd., Hsinchu (TW)

(72) Inventors: Tai-Yen Peng, Hsinchu (TW); Tsung-Hsien Chang, Shalu Township (TW); Yu-Shu Chen, Hsinchu (TW); Chih-Yuan Ting, Taipei (TW); Jyu-Horng Shieh, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/560,623

(22) Filed: Sep. 4, 2019

(65) Prior Publication Data
US 2020/0135806 A1    Apr. 30, 2020

Related U.S. Application Data

(60) Provisional application No. 62/753,659, filed on Oct. 31, 2018.

(51) Int. Cl.
*H01L 27/22* (2006.01)
*H01L 43/12* (2006.01)
*H01L 43/08* (2006.01)
*G11C 11/16* (2006.01)

(52) U.S. Cl.
CPC ............ *H01L 27/228* (2013.01); *H01L 43/08* (2013.01); *H01L 43/12* (2013.01); *G11C 11/1659* (2013.01)

(58) Field of Classification Search
CPC .............................. H01L 27/222; H01L 43/08
See application file for complete search history.

(56) References Cited

U.S. PATENT DOCUMENTS

| 2017/0053967 | A1 | 2/2017 | Chuang et al. | |
| 2017/0104029 | A1* | 4/2017 | Li | G11C 11/161 |
| 2018/0122445 | A1* | 5/2018 | Lee | H01L 43/02 |
| 2018/0166501 | A1 | 6/2018 | Chuang et al. | |

FOREIGN PATENT DOCUMENTS

JP    2004311513 A    11/2004

* cited by examiner

*Primary Examiner* — Jay C Chang
*Assistant Examiner* — Mikka Liu
(74) *Attorney, Agent, or Firm* — Slater Matsil, LLP

(57) ABSTRACT

A semiconductor device includes a substrate; a memory array over the substrate, the memory array including first magnetic tunnel junctions (MTJs), where the first MTJs are in a first dielectric layer over the substrate; and a resistor circuit over the substrate, the resistor circuit including second MTJs, where the second MTJs are in the first dielectric layer.

20 Claims, 20 Drawing Sheets

| | Hi-R1 | Hi-R2 | Hi-R3 | Hi-R4 | Hi-R5 | Rtotal |
|---|---|---|---|---|---|---|
| Initial | Rap | Rap | Rap | Rap | Rap | 5Rap = 10Rp |
| 1) +0.6V (to turn odd Hi-R to Rp) | Rp | Rap | Rp | Rap | Rp | 2Rap + 3Rp=7Rp |
| 2) -0.6V (to turn even Hi-R to Rp) | Rp | Rp | Rp | Rp | Rp | 5Rp |
| 3) -0.8V (to turn odd Hi-R to Rap) | Rap | Rp | Rap | Rp | Rap | 3Rap+2Rp=8Rp |
| 4) +0.6V (to turn odd Hi-R to Rp) | Rp | Rp | Rp | Rp | Rp | 5Rp |
| 5) +0.8V (to turn even Hi-R to Rap) | Rp | Rap | Rp | Rap | Rp | 3Rp+2Rap=7Rp |
| 6) -0.6V (to turn even Hi-R to Rp) | Rp | Rp | Rp | Rp | Rp | 5Rp |

Fig. 17

|  | Hi-R1 | Hi-R2 | Hi-R3 | Hi-R4 | Hi-R5 | Rtotal |
|---|---|---|---|---|---|---|
| Initial | Rap | Rap | Rap | Rap | Rap | 5Rap = 10Rp |
| 1) +0.6V (to turn Hi-R to Rp) | Rp | Rp | Rp | Rp | Rp | 5Rap |
| 2) -0.6V (to keep HiR to Rp) | Rp | Rp | Rp | Rp | Rp | 5Rap |
| 3) -0.8V (to turn Hi-R to Rap) | Rap | Rap | Rap | Rap | Rap | 5Rap = 10Rp |
| 4) +0.6V (to turn Hi-R to Rp) | Rp | Rp | Rp | Rp | Rp | 5Rap |

Fig. 19

SEMICONDUCTOR DEVICE WITH MAGNETIC TUNNEL JUNCTIONS

PRIORITY CLAIM AND CROSS-REFERENCE

This application claims priority to U.S. Provisional Patent Application No. 62/753,659, filed Oct. 31, 2018, entitled "Hybrid Function Circuit for Semiconductor Device," which application is hereby incorporated by reference in its entirety.

BACKGROUND

Semiconductor memories are used in integrated circuits for electronic applications, including radios, televisions, cell phones, and personal computing devices, as examples. One type of semiconductor memory device is Magneto-Resistive Random Access Memory (MRAM), which involves spin electronics that combines semiconductor technology and magnetic materials and devices. The spins of electrons, through their magnetic moments, rather than the charge of the electrons, are used to indicate bit values. A typical MRAM cell may include a Magnetic Tunnel Junction (MTJ), which includes a pinned layer, a free layer, and a tunneling barrier layer between the pinned layer and the free layer. Depending on the directions of the magnetic moments of the pinned layer and the free layer in an MTJ, the MTJ may exhibit a high resistance or a low resistance, which may be detected and used to indicate a logic zero or logic 1.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17 illustrates a method of programming the equivalent resistance of the resistor circuit of FIG. 16A, in an embodiment.

FIG. 19 illustrates a method of programming the equivalent resistance of the resistor circuit of FIG. 18A, in an embodiment.

DETAILED DESCRIPTION

Figure 1:
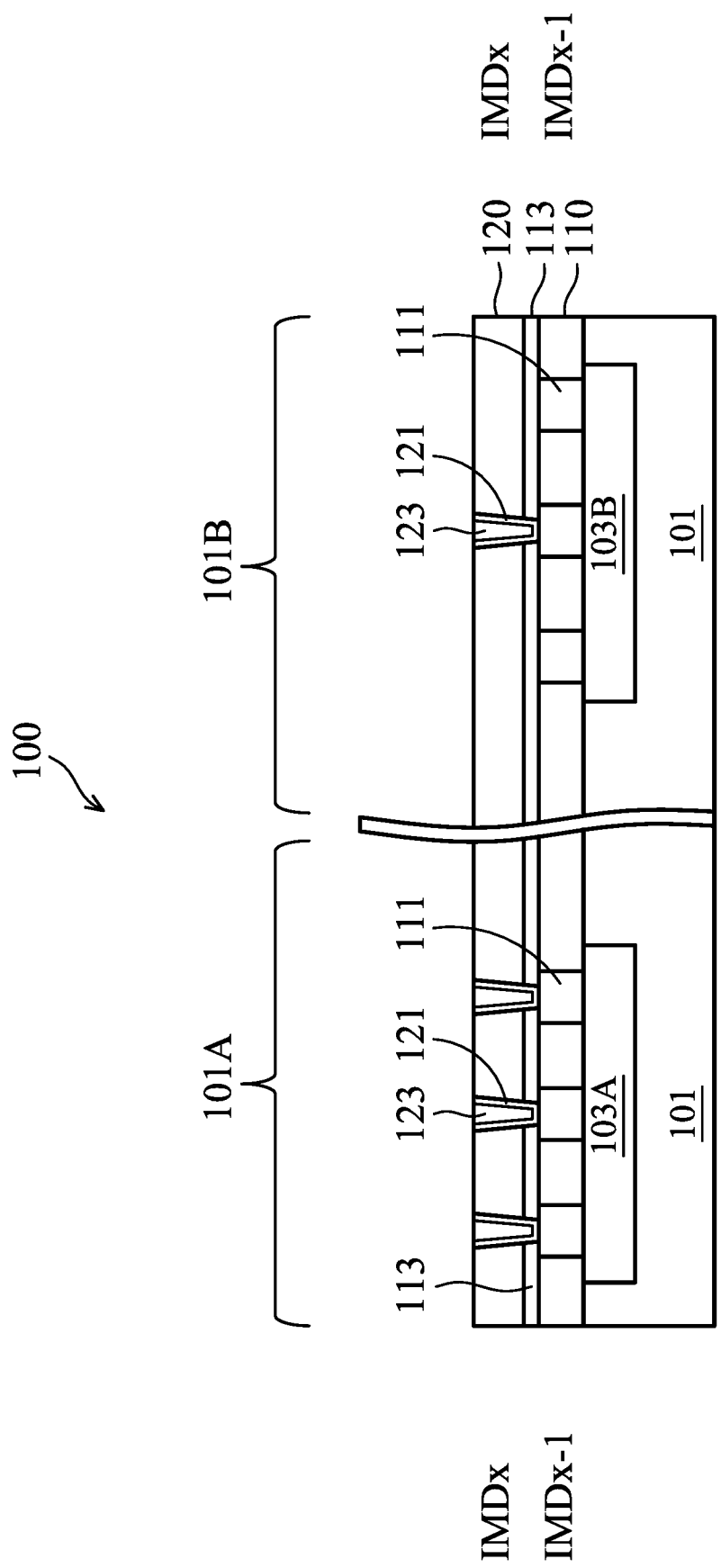
FIGS. 1-7 illustrate cross-sectional views of a semiconductor device at various stages of fabrication, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same numeral in different figures refers to the same or similar component formed by a same or similar process using a same or similar material(s).

Embodiments of the present disclosure are discussed in the context of Magnetic Tunnel Junction (MTJ) devices and the formation of MTJ devices. In some embodiments, a first plurality of MTJs are formed in a memory region of a semiconductor device to form a memory array configured to store data bits, and a second plurality of MTJs are formed in a logic region of the semiconductor device to form a resistor device configured to provide an equivalent electrical resistance. In the illustrated embodiments, the MTJs in the memory region and the MTJs in the logic region are formed in a same processing step and in a same Inter-Metal Dielectric (IMD) layer over a substrate of the semiconductor device, which reduces manufacturing time and cost compared with conventional methods where resistance devices are formed using sheet type resistors and are formed in a separate processing step, e.g., after the MTJs of the memory array are formed. In addition, by using the MTJs as resistors of the resistance device, higher integration density is achieved in the semiconductor device, since the MTJs take up less space in the layout design than traditional sheet type resistors. The MTJs in a resistance device may be electrically coupled in series or in parallel to provide different resistance values. In the illustrated embodiments, the resistance device comprising multiple MTJs has a plurality of possible resistance values, and is programmable by supplying a pre-determined sequence of electrical currents through the resistance device. Therefore, the embodiment resistance device has the additional advantage of being able to provide multiple resistance values for different applications.

FIGS. 1-7 illustrate cross-sectional views of a semiconductor device 100 at various stages of fabrication, in accordance with an embodiment. The semiconductor device 100 includes MTJs and may also be referred to as an MTJ device. As illustrated in FIG. 1, the semiconductor device 100 includes a memory region 101A and a logic region 101B over a same substrate 101, where one or more memory devices (e.g., a memory array comprising MTJs) are formed in the memory region 101A and one or more logic devices (e.g., logic circuits, resistor devices comprising MTJs, or the like) are formed in the logic region 101B.

Referring to FIG. 1, electrical components 103A and 103B are formed in or on the substrate 101, and an interconnect structure, which includes a plurality of Inter-Metal Dielectric (IMD) layers and electrically conductive features (e.g., metal lines and vias) formed in the IMD layers, is formed over the substrate 101 to connect the electrical components 103A/103B to form functional circuits, such as a memory array in the memory region 101A, and a resistor device in the logic region 101B.

The substrate 101 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The electrical components 103A/103B may be, e.g., transistors, diodes, capacitors, resistors, or the like, formed by any suitable formation method.

In some embodiments, one or more Inter-Layer Dielectric (ILD) layers (not illustrated in FIG. 1, but illustrated in FIG. 14) are formed over the substrate 101, and a plurality of Inter-Metal Dielectric (IMD) layers are formed over the ILD layer(s). The IMD layers are denoted as $IMD_x$, where x=0, 1, 2, . . . , where $IMD_0$ refers to the lowest (e.g., closest to the substrate 101) IMD layer, and the index x increases by 1 for each additional IMD layer (see, e.g., FIG. 14). The ILD layer(s) and the IMD layers may be formed of any suitable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The ILD layer(s) and the IMD layers may be formed by any acceptable deposition process, such as spin coating, physical vapor deposition (PVD), chemical vapor deposition (CVD), the like, or a combination thereof.

In some embodiments, electrically conductive features, such as contact plugs, are formed in the ILD layer(s) to electrically connect to the electrical components 103A/103B. In some embodiments, electrically conductive features, such as conductive lines and vias, are formed in each IMD layer to electrically connect to underlying conductive features. The electrically conductive features in the ILD layer(s) and the IMD layers may be formed through any suitable process, such as deposition, damascene, dual damascene, the like, or combinations thereof.

FIG. 1 illustrates an IMD layer $IMD_{x-1}$ over the substrate 101, a dielectric layer 120 (which is a portion of the IMD layer $IMD_x$), and an etch stop layer 113 between the dielectric layer 120 and the IMD layer $IMD_{x-1}$. Although the IMD layer $IMD_{x-1}$ is illustrated in FIG. 1 as over and contacting the substrate 101, there may be other layers between the IMD layer $IMD_{x-1}$ and the substrate 101 (see, e.g., FIG. 14). For simplicity, in subsequent figures, the substrate 101 and the electrical components 103A/103B may not be illustrated.

As illustrated in FIG. 1, electrically conductive features 111 are formed in the IMD layer $IMD_{x-1}$ and are electrically coupled to the electrical components 103A/103B. The etch stop layer 113 is formed over the IMD layer $IMD_{x-1}$ and is used to protect the underlying structures and provide a control point for a subsequent etching process through, e.g., the dielectric layer 120. In an embodiment, the etch stop layer 113 is formed of silicon nitride using plasma-enhanced CVD (PECVD), although other dielectric materials such as nitride, carbide, boride, combinations thereof, or the like, and alternative techniques of forming the etch stop layer 113, such as low pressure CVD (LPCVD), PVD, or the like, could alternatively be used.

In FIG. 1, the dielectric layer 120 is formed over the etch stop layer 113 and is formed of, e.g., an oxide such as tetraethyl orthosilicate (TEOS). Vias 123 are formed in the dielectric layer 120 and extend through the etch stop layer 113 to electrically couple to the underlying conductive features 111. The vias 123 may be formed of an electrically conductive material, such as copper, tungsten, titanium nitride, alloys thereof, or the like, by PVD, CVD, Atomic-Layer Deposition (ALD), or other suitable deposition process. As illustrated in FIG. 1, a barrier layer 121 is formed between the vias 123 and the dielectric layer 120. The barrier layer 121 may be formed of one or more layers of titanium, titanium nitride, tantalum, tantalum nitride, tungsten nitride, ruthenium, rhodium, platinum, other noble metals, other refractory metals, their nitrides, combinations of these, or the like. The barrier layer 121 may be formed through CVD, although other techniques such as PVD or ALD could alternatively be used. The vias 123 may be referred to as the bottom vias of the MTJs formed subsequently.

Figure 2:
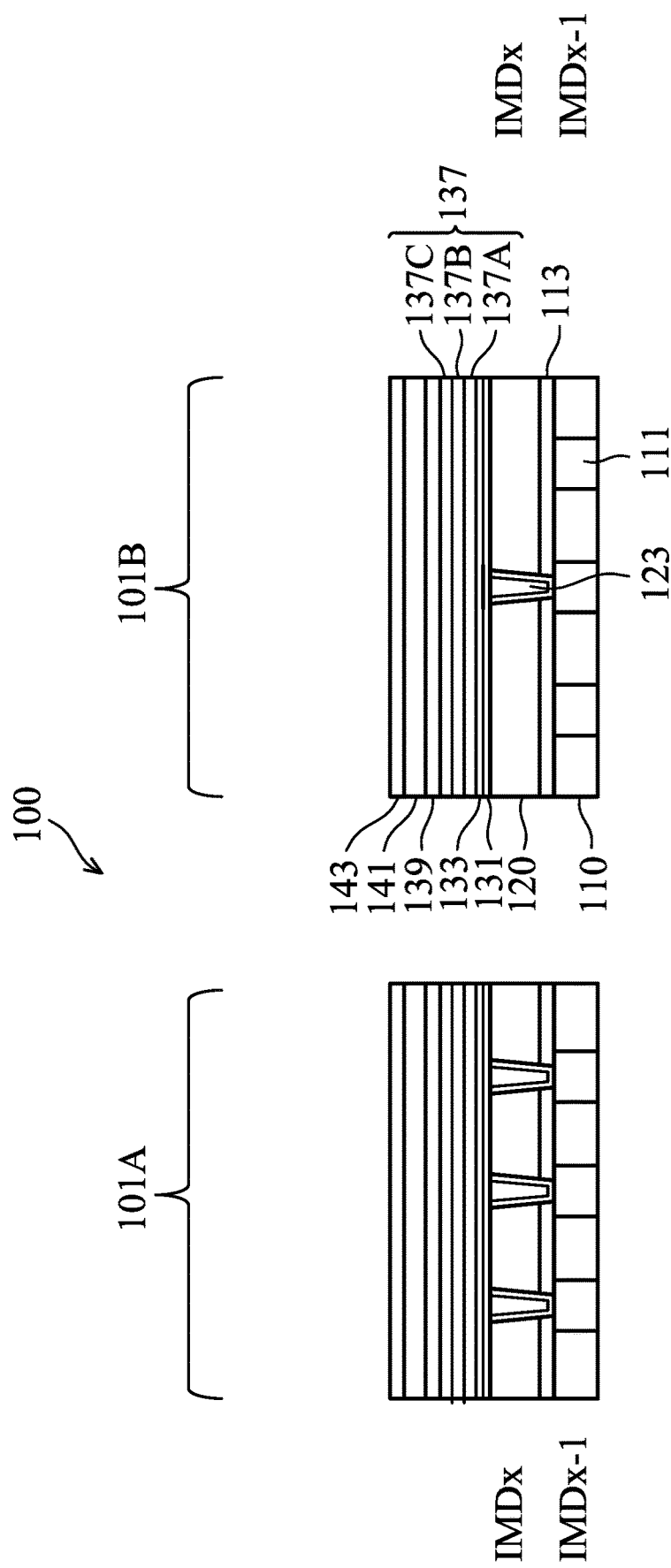

Next, in FIG. 2, a plurality of electrically conductive layers are deposited (e.g., blanket deposited) successively over the dielectric layer 120 of FIG. 1, using suitable deposition method such as PVD, CVD, ALD, the like, or combinations thereof. In some embodiments, the plurality of electrically conductive layers includes bottom electrode layers (e.g., 131 and 133), an MTJ layer 137, and top electrode layers (e.g., 139, 141, and 143). In subsequent processing, the MTJ layer 137 will be patterned to form the MTJs, the bottom electrode layers will be patterned to form bottom electrodes of the MTJs, and the top electrode layers will be patterned to form top electrodes of the MTJs.

In FIG. 2, the bottom electrode layers include a conductive layer 131 and a conductive layer 133. In an embodiment, the conductive layer 131 is formed of tantalum nitride (e.g., TaN), and the conductive layer 133 is formed of titanium nitride (e.g., TiN). A thickness of the conductive layer 131 may be between about 30 angstroms and about 70 angstroms, such as 50 angstroms, and a thickness of the conductive layer 133 may be between about 30 angstroms and about 70 angstroms, such as 50 angstroms. The conductive layer 133 may function as a diffusion barrier layer, and may also function as a buffer layer for the subsequently formed MTJ layer 137 such that the crystal growth direction of the subsequently formed MTJ layer 137 is along a targeted direction (e.g., along the [001] direction).

In some embodiments, the MTJ layer 137 includes three sublayers, such as a pinned layer 137A, a tunneling barrier layer 137B, and a free layer 137C. Each of the pinned layer 137A and the free layer 137C comprises a suitable magnetic material(s), such as cobalt iron boron (CoFeB), cobalt iron (CoFe), nickel iron (NiFe), a synthetic magnetic material comprising Co/Ru/Co, or the like. In an embodiment, the tunneling barrier layer comprises magnesium oxide (MgO). A thickness of the MTJ layer 137 may be between about 270 angstroms and about 330 angstroms, such as about 300 angstroms.

The pinned layer 137A, the tunneling barrier layer 137B, and the free layer 137C are patterned in subsequent processing to from MTJs. When the magnetic moment directions of the free layer and the pinned layer in an MTJ are the same (also referred to as in parallel state), the resistance of the MTJ is low. When the magnetic moment directions of the free layer and the pinned layer are opposite to each other (also referred to as in anti-parallel state), the resistance of the MTJ is high. The resistance of the MTJ is non-volatile and may be controlled by a writing current. For example, when the writing current is over a pre-determined threshold, the free layer's magnetic moment will change from a first state (e.g., the parallel state) to a second state (e.g., the anti-parallel state), which causes the MTJ to change from a first resistance state (e.g., a low resistance state) to a second resistance state (e.g., a high resistance state). Details regarding the switching of an example MTJ between the parallel state and the anti-parallel state are discussed hereinafter with reference to FIGS. 15A and 15B.

In the example of FIG. 2, the top electrode layers include conductive layers 139, 141, and 143. In some embodiments, the conductive layer 139 comprises ruthenium (Ru) and functions as a capping layer to protect the MTJ layer 137. A thickness of the conductive layer 139 may be between about 50 angstroms and about 100 angstroms, such as about 75 angstroms. In some embodiments, the conductive layer 141 comprises tungsten, titanium, titanium nitride, tungsten-doped carbide, or the like, and the conductive layer 143 comprises titanium nitride, titanium, tungsten-doped carbide, or the like. In some embodiments, the conductive layer 141 and the conductive layer 143 are formed of a same material. In other embodiments, the conductive layer 141 and the conductive layer 143 are formed of different materials. In some embodiments, the conductive layer 141 is omitted, and the conductive layer 143 is formed direct on (e.g., in physical contact with) the conductive layer 139. In embodiments where both the conductive layers 141 and 143 are formed, a total thickness of the conductive layers 141 and 143 is between about 600 angstroms and about 1200 angstroms. In embodiments where the conductive layer 141 is omitted, a thickness of the conductive layer 143 is between about 600 angstroms and about 1200 angstroms. The layer structure for the bottom electrode layers, the MTJ layer, and the top electrode layers illustrated in FIG. 2 is merely a non-limiting example. Other layer structures and other dimension for the layer structure are also possible and are fully intended to be included within the scope of the present disclosure.

Figure 3:
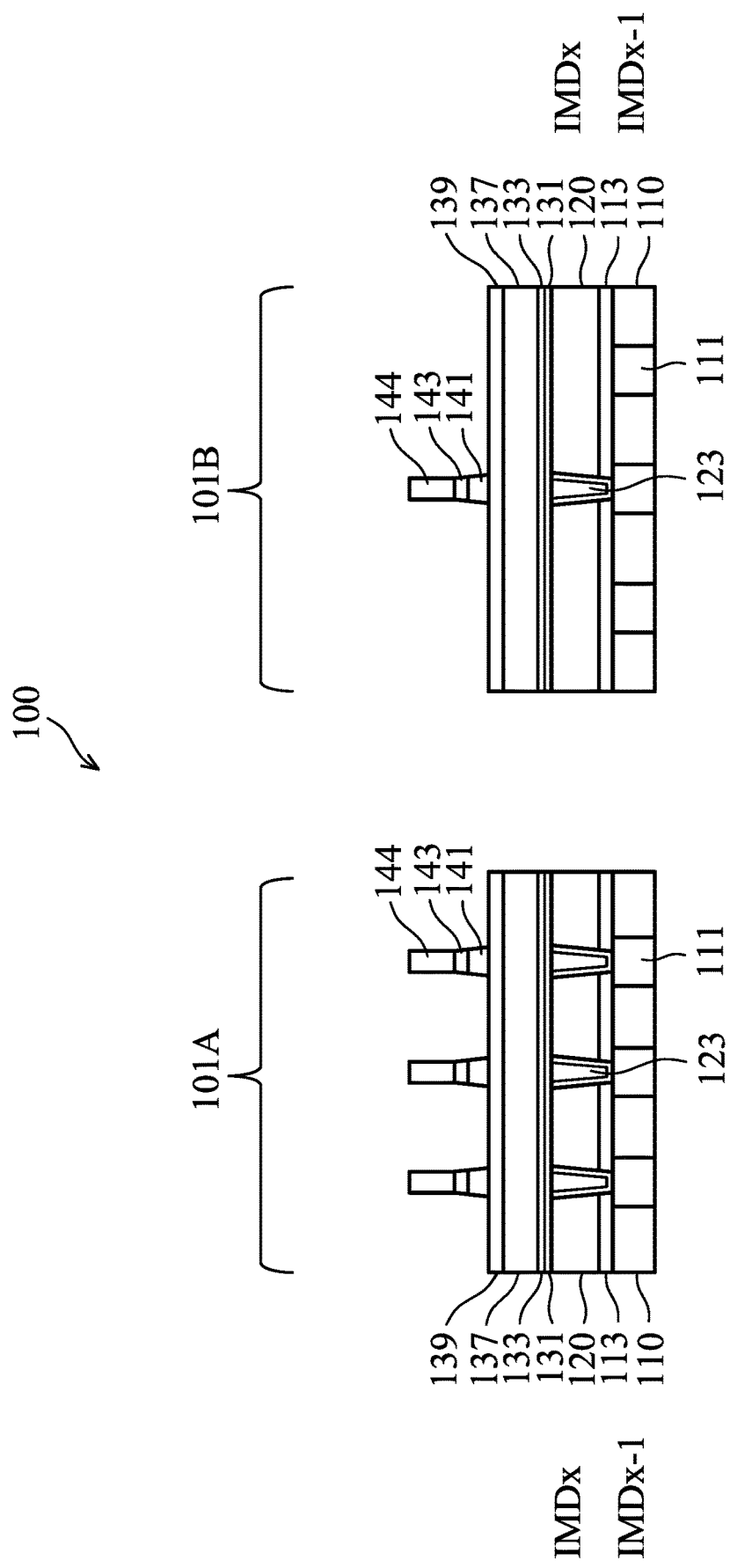

Next, in FIG. 3, a patterned mask layer 144 is formed over the conductive layer 143. The patterned mask layer 144 may be formed by depositing a mask layer (e.g., silicon nitride, or silicon oxide) over the conductive layer 143 and patterning the deposited mask layer using, e.g., photolithography and etching techniques. The patterns of the patterned mask layer 144 are then transferred to the conductive layers 143 and 141 using, e.g., a first anisotropic etching process. The patterned mask layer 144 is at locations that are directly over corresponding vias 123, as illustrated in FIG. 3.

Figure 4:
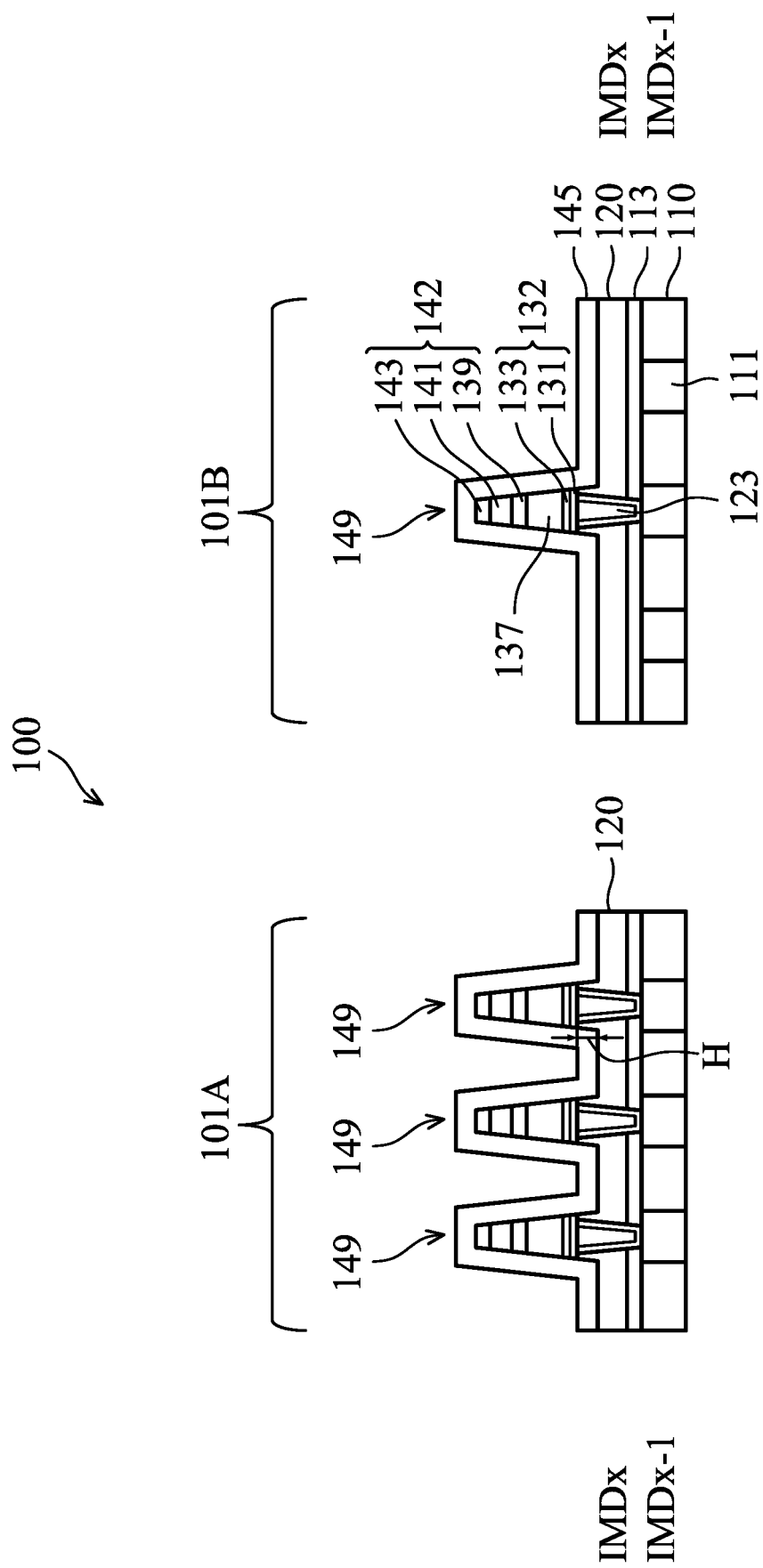

Next, in FIG. 4, a second anisotropic etching process, such as a dry etching process, is performed to pattern the conductive layer 139, the MTJ layer 137 and the conductive layers 131 and 133. The dry etching process may be a reactive ion etching (RIE), an ion beam etching (IBE), or the like, as examples. After the second anisotropic etching process, the patterned MTJ layer form MTJs 137, the patterned bottom electrode layers (e.g., 131 and 133) form the bottom electrode 132 of the MTJs, and the patterned top electrode layers (e.g., 139, 141, and 143) form the top electrode 142 of the MTJs. In the discussion herein, the bottom via 123 with the barrier layer 121, the bottom electrode 132, the MTJ 137, and the top electrode 142 may be collectively referred to as an MTJ structure 149. FIG. 4 illustrates three MTJ structures 149 in the memory region 101A and one MTJ structure 149 in the logic region 101B as a non-limiting example, and the number of MTJ structures in the memory region 101A and the logic region 101B may be any suitable value. These and other variations are fully intended to be included within the scope of the present disclosure.

In some embodiments, during the second anisotropic etching process, residues of the conductive materials (e.g., materials from layers 131, 133, 137, 139, 141, or 143 removed by the second anisotropic etching process) may accumulate along the sidewalls of the MTJs 137, which may cause short circuit of the MTJs 137. To prevent the short circuit, the second anisotropic etching process may over-etch to remove the residues of the conductive material from the sidewalls of the MTJs 137. The over-etching of the second anisotropic etching process may remove top portions of the dielectric layer 120 (e.g., portions not directly under the MTJ structure 149). For example, an offset H between a first upper surface of the dielectric layer 120 (e.g., directly under the MTJ structure 149) and a second upper surface of the dielectric layer 120 (e.g., recessed by the over-etching of the second anisotropic etching process) is between about 100 angstroms and about 300 angstroms.

Still referring to FIG. 4, after the second anisotropic etching process, a spacer layer 145 is formed (e.g., conformally deposited) over the MTJ structures 149 and the dielectric layer 120. The spacer layer 145 may comprise a suitable dielectric layers, such as a nitride (e.g., silicon nitride, or silicon carbon nitride) formed by CVD, PVD, ALD, or other suitable process.

Figure 5:
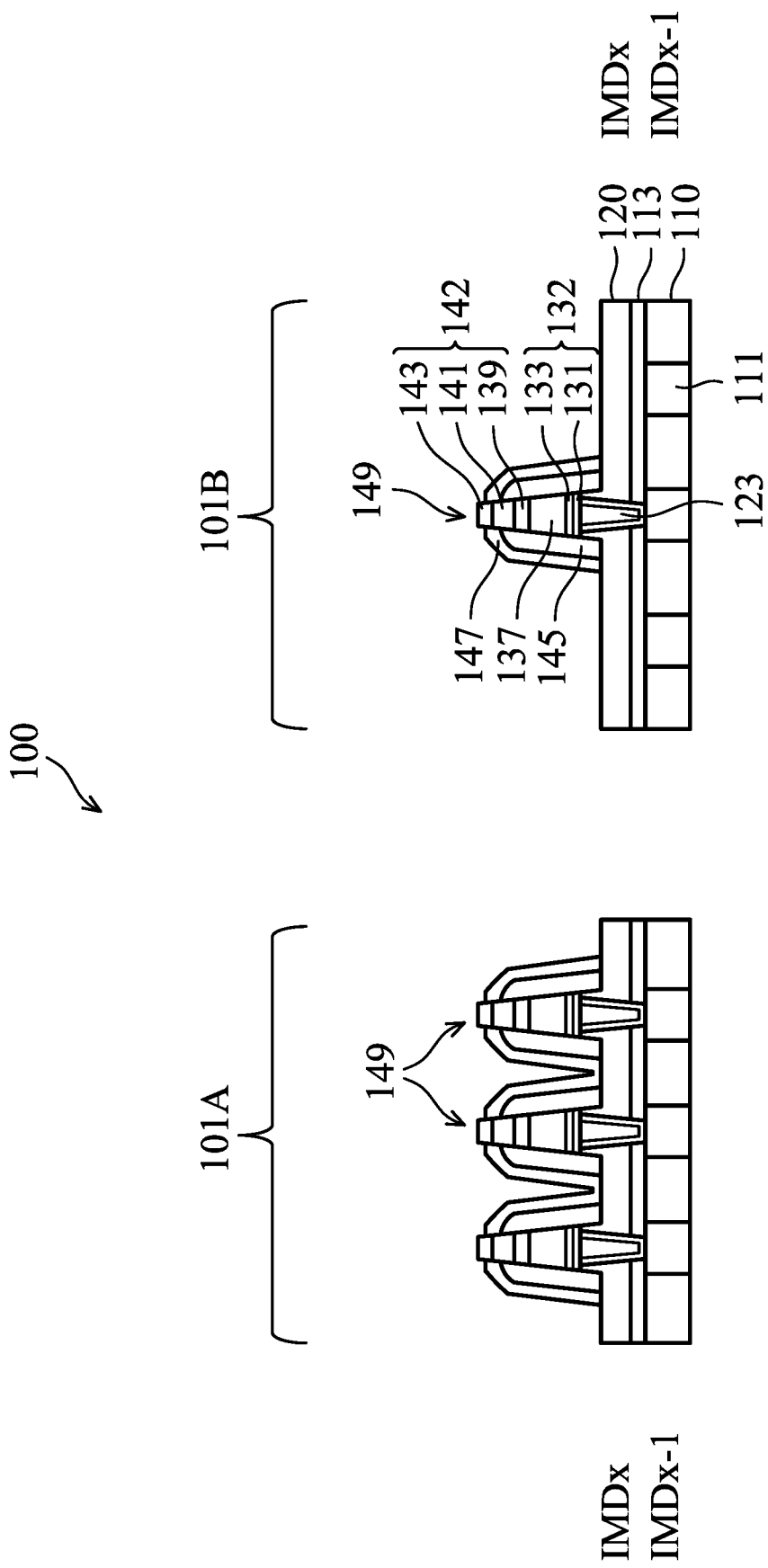

Next, in FIG. 5, a dry etching process is performed to etch the spacer layer 145 to expose top portions of the MTJ structures 149 (e.g., portions of the conductive layers 143/141), and an optional spacer layer 147 is formed over the spacer layer 145. In some embodiments, the spacer layer 147 comprises a nitride such as silicon nitride, or silicon carbon nitride. In other embodiments, the spacer layer 147 comprises an oxide such as silicon oxide while the spacer layer 145 comprises an nitride. In some embodiments, the spacer layer 147 is omitted.

Next, a dry etch process, which may be anisotropic, is performed to remove horizontal portions of the spacer layer 147 (if formed). After the dry etch process, portions of the spacer layers 145/147 along sidewalls of the MTJ structures 149 remain, and the top electrodes 142 of the MTJ structures 149 are exposed. In some embodiments, the resistance of the MTJ structure 149 is inversely proportional to the size (e.g., width) of the MTJ structures 149, and therefore, the size (e.g., the width) of the patterned mask layer 144 (see FIG. 3) may be adjusted to adjust the resistance values of the MTJ structures 149. For example, increasing the width of the patterned mask layer 144 results in increased width of the MTJ structure 149 and decreased resistance of the MTJ structure 149, and vice versa.

Figure 6:
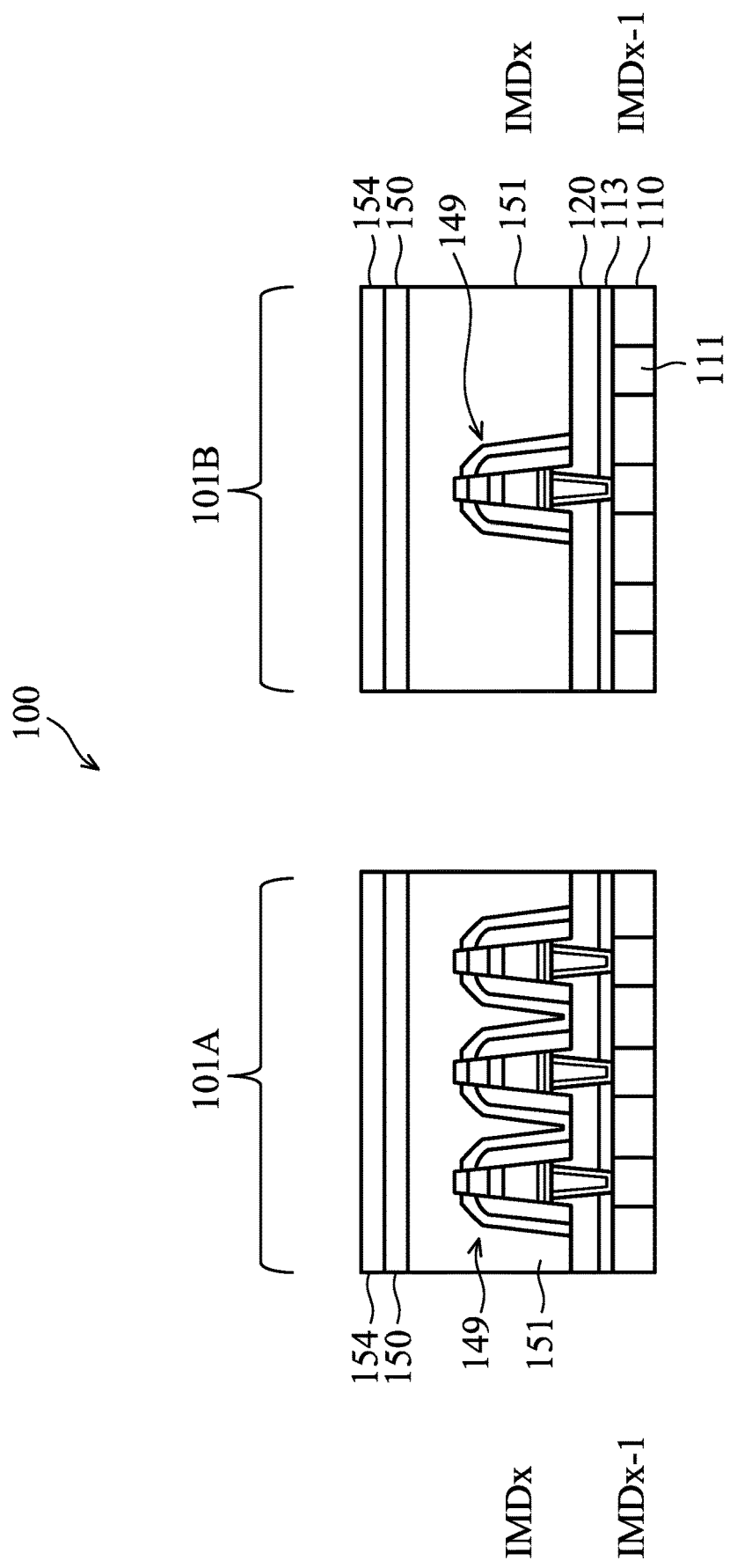
Figure 7:
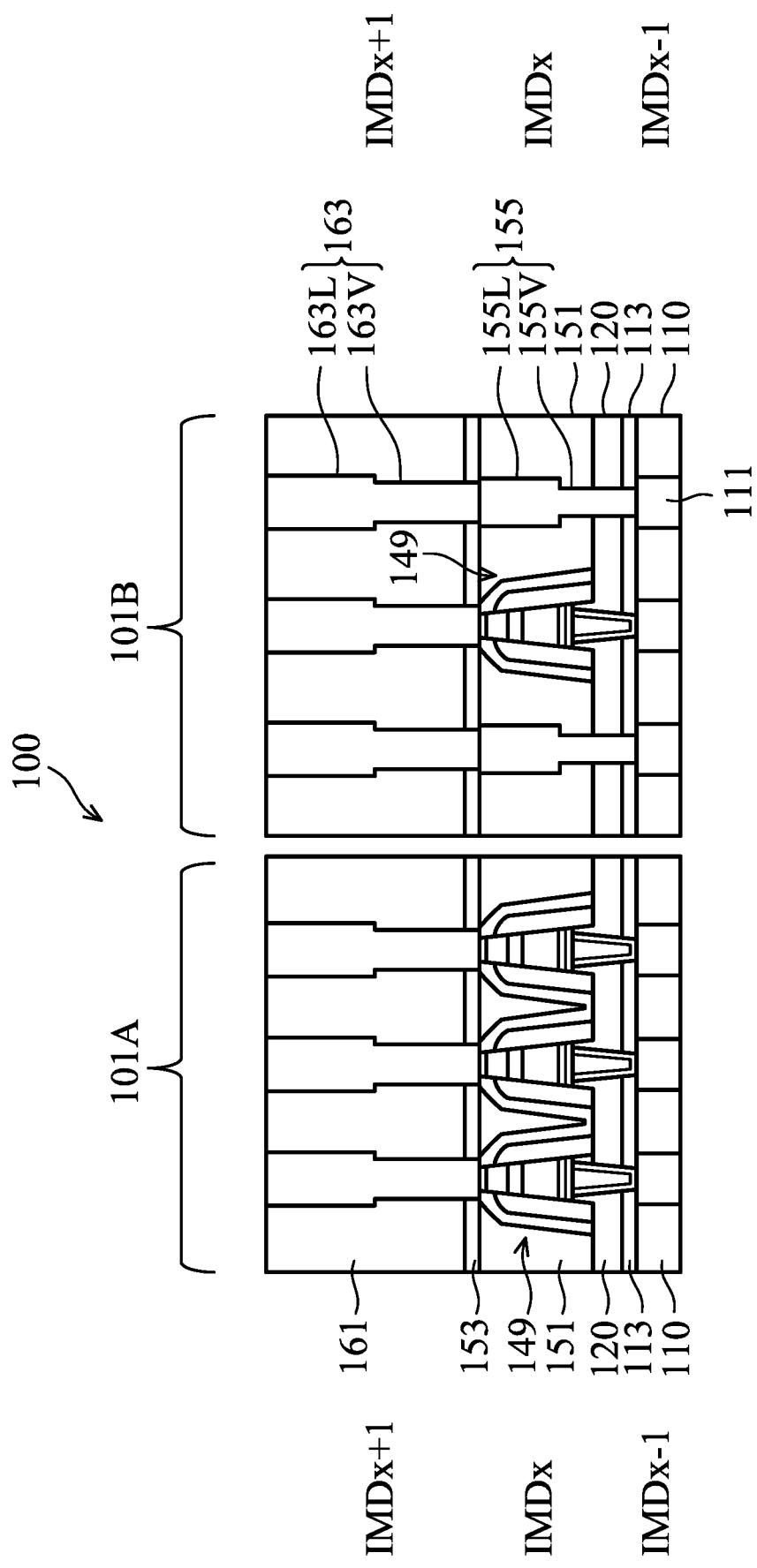

Referring next to FIG. 6, a dielectric layer 151, such as a low-K oxide, is formed over the dielectric layer 120 and the MTJ structures 149. In the illustrated embodiment, a nitrogen-free anti-reflective layer (NFARL) 150 is formed over the dielectric layer 151, and a photoresist layer 154 is formed over the NFARL 150. The photoresist layer 154 and the NFARL 150 are then used to pattern the dielectric layer 151 in subsequent processing to form conductive features 155 in the IMD layer $IMD_x$, as illustrated in FIG. 7. Note that in the illustrated embodiment, the IMD layer $IMD_x$ includes the dielectric layer 120 and the dielectric layer 151.

Next, in FIG. 7, the conductive features 155 are formed in the IMD layer $IMD_x$. The conductive features 155 may include conductive lines 155L and vias 155V formed using suitable formation methods such as damascene, dual-damascene, deposition, plating, combinations thereof, or the like. Next, an etch stop layer 153 and an IMD layer $IMD_{x+1}$ are formed over the IMD layer $IMD_x$, and conductive features 163 (e.g., conductive lines 163L and vias 163V) are formed in the IMD layer $IMD_{x+1}$. The conductive features 163 extends through the etch stop layer 153 and are electrically coupled to the conductive features 155 and the MTJ structures 149, as illustrated in FIG. 7. The number of MTJ structures 149 and the electrical connection between the MTJ structures 149 and the conductive features (e.g., 163, 155) illustrated in FIG. 7 are merely non-limiting example. Other numbers of MTJ structures 149 and other electrical connections between the MTJ structures 149 and the conductive features are possible, and are fully intended to be included within the scope of the present disclosure.

Figure 13:
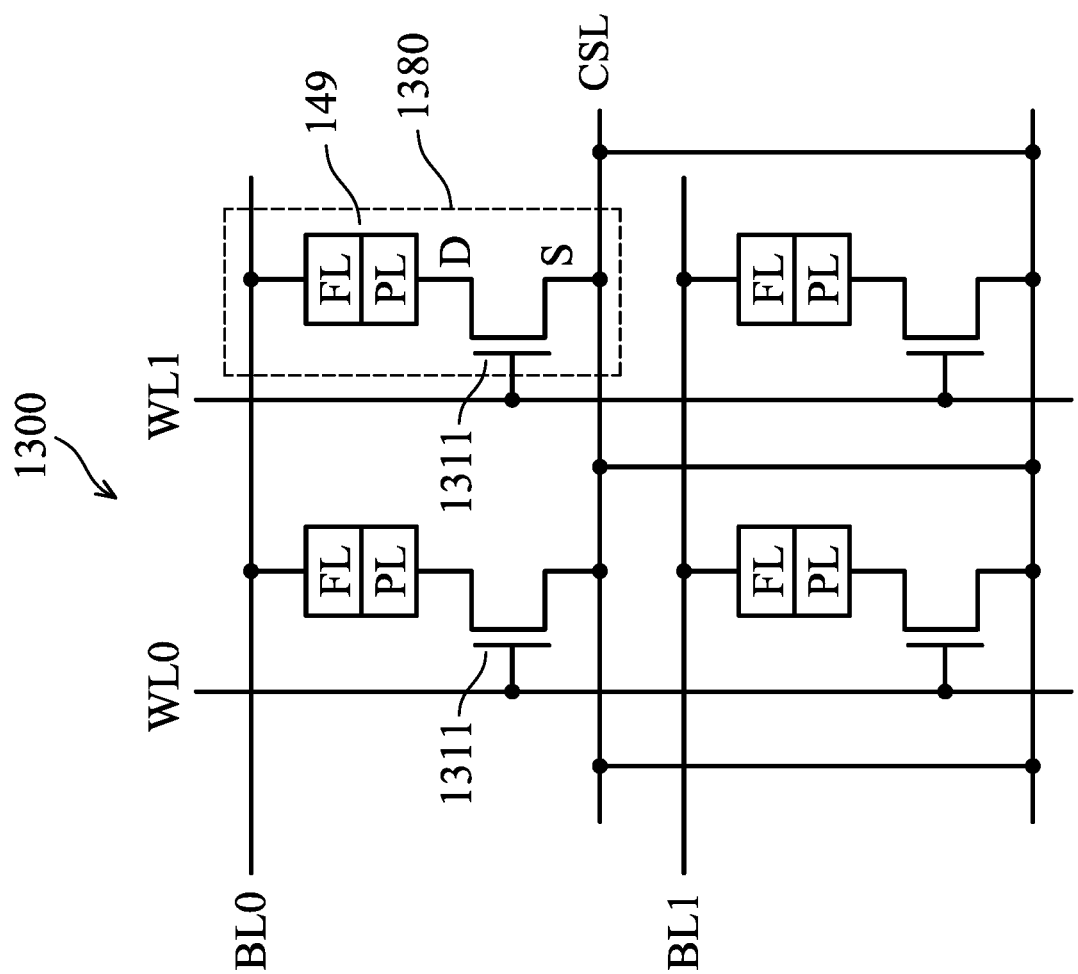
FIG. 13 illustrates a schematic view of a memory array, in accordance with an embodiment.
Figure 14:
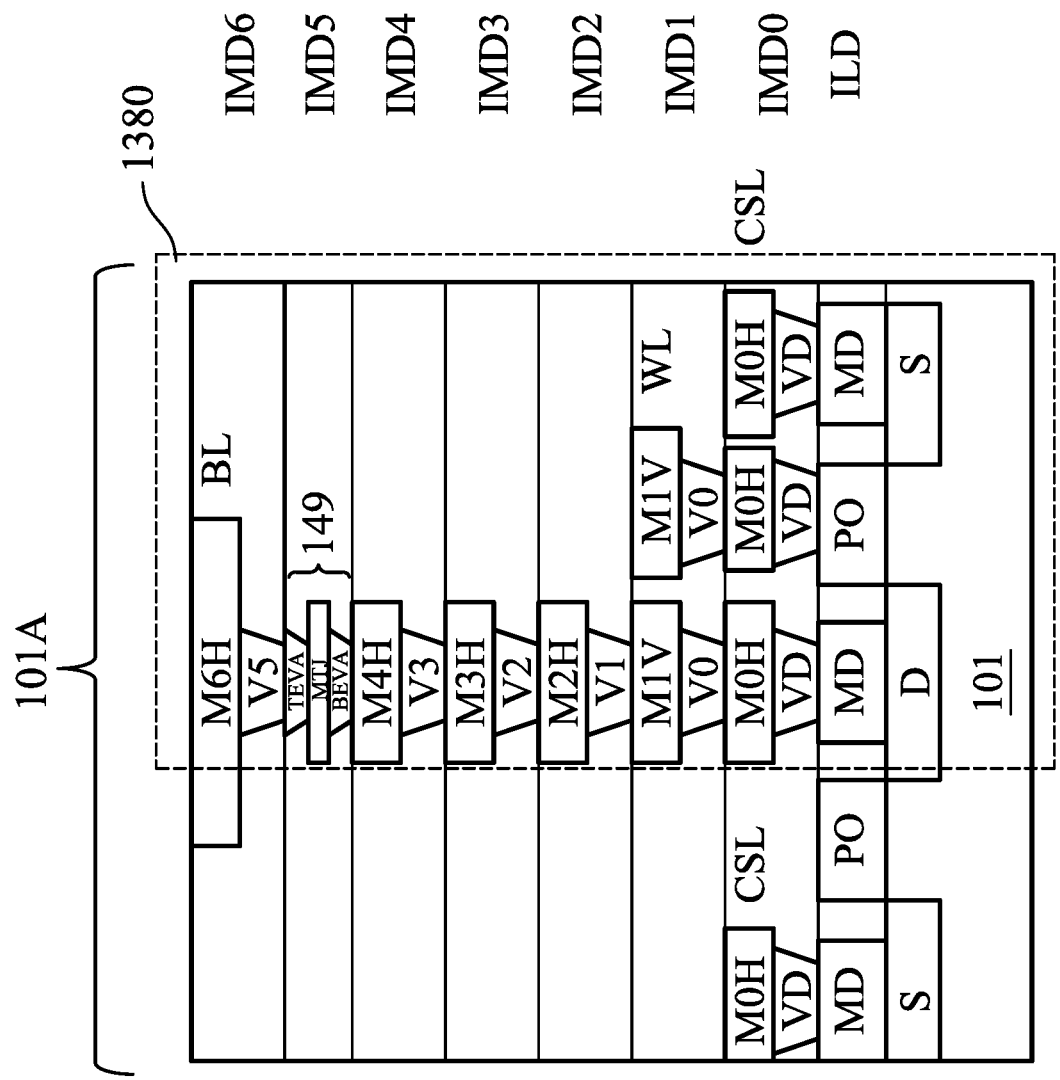
FIG. 14 illustrates a schematic cross-sectional view of the memory array of FIG. 13, in accordance with an embodiment.

Additional processing may follow the processing illustrated in FIG. 7 to complete the manufacturing of the semiconductor device 100, as one skilled in the art will readily appreciate, thus details are not discussed here. In the illustrated embodiment, the MTJ structures 149 in the memory regions 101A form a memory device, such as a memory array. FIGS. 13 and 14 illustrate examples regarding the formation of the memory array in the memory region 101A using the MTJ structures 149, details of which are discussed hereinafter. Therefore, the MTJ structures 149 (or the MTJs 137) in the memory region 101A are configured to store data bits (e.g., digital bits such as zeros and ones). In particular, each MTJ is configured to store one bit (e.g., a bit having a value of one or a value of zero), in the illustrated embodiment.

In contrast, the MTJ structures 149 in the logic region 101B function as resistors, which resistors may be used for, e.g., controlling a specific current or a specific voltage, limiting cross voltage distribution, limiting the current in a circuit, or as a resistance sensor to detect an environmental condition (e.g., the resistance may linearly change with the condition being detected). In some embodiments, multiple MTJs structures 149 in the logic region 101B are electrically coupled together to form a resistor device (may also be referred to as a resistor circuit) and to provide an equivalent electrical resistance (may also be referred to as equivalent resistance). FIGS. 9A, 10, 11, and 12 provide various embodiments where multiple MTJ structures 149 in the logic region 101B are electrically coupled together to form a resistor device, details of which are discussed hereinafter.

As illustrated in FIG. 7, MTJ structures 149 are formed in a same dielectric layer (e.g., the IMD layer $IMD_x$) of the semiconductor device 100 in both the memory region 101A and the logic region 101B. In the illustrated embodiment, the MTJ structures 149 in the memory region 101A and in the logic region 101B are formed in a same processing step and have a same structure. However, the MTJ structures 149 in the memory region 101A function as one or more memory devices, and the MTJ structures 149 in the logic region 101B function as one or more resistor devices. In other words, the presently disclosed method allows memory devices and resistor devices to be formed in a same layer of the semiconductor device 100 in a same processing step, which reduces manufacturing time and cost compared with traditional methods where memory devices and resistor devices are formed in different layers of the semiconductor device in different processing steps. For example, the photolithography masks and the extra processing steps related to forming the resistor devices are obviated by the present disclosure.

Figure 8B:
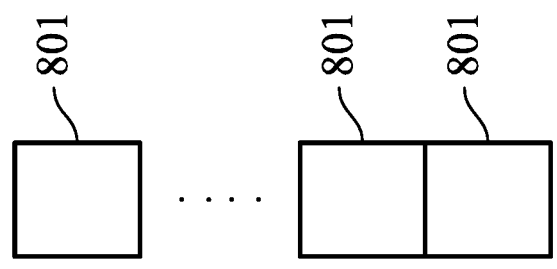
FIG. 8B illustrates a layout for sheet type resistors, in an embodiment.
Figure 8A:
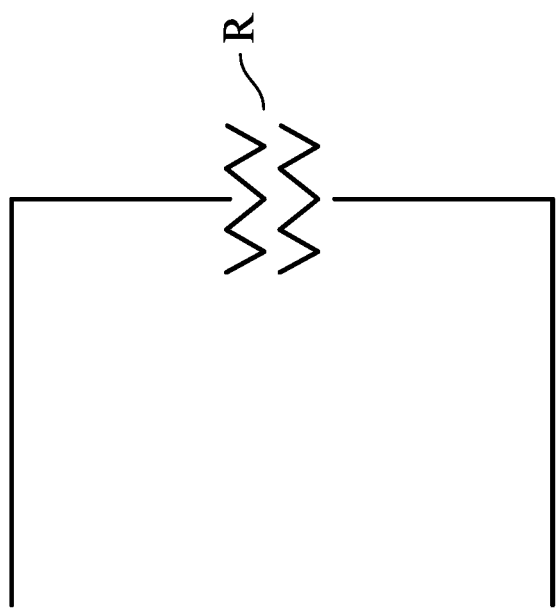
FIG. 8A illustrates a circuit diagram having a resistor, in an embodiment.

Another advantage of the presently disclosed method is higher integration density of the semiconductor device formed due to the use of MTJ structures 149 as the resistors of the resistor device. To illustrate the advantage, FIG. 8A shows a circuit with a resistor device R, and FIG. 8B illustrates the layout (e.g., a top view) of a reference design where sheet type resistors 801 are used to form the resistor device R instead of using MTJ structures 149. In particular, each of the sheet type resistors 801 in FIG. 8B is a rectangular sheet of conductive material (e.g., TiN or TaN) formed in, e.g., a top IMD layer of a semiconductor device, to provide a unit resistance $R_0$ (e.g., $R_0$ may have a value between about 0.5 kΩ and about 10 kΩ). Multiple sheet type resistors 801 are concatenated (e.g., coupled in series) to provide a larger resistance. For example, each of the sheet type resistors 801 may have a width of 0.2 μm and a length of 0.4 μm, with an area of 0.4×0.2=0.08 μm². To provide a resistance of $10R_0$, ten sheet type resistors 801 are concatenated together, which requires a total area of 0.8 μm² in the layout design. In contrast, a resistor device using MTJ structures 149 uses a much smaller area (e.g., 6.5% of the total area required by the sheet type resistors) in the layout, as described below with reference to FIGS. 9A and 9B, which allows a much higher integration density for the semiconductor device 100.

Figure 9A:
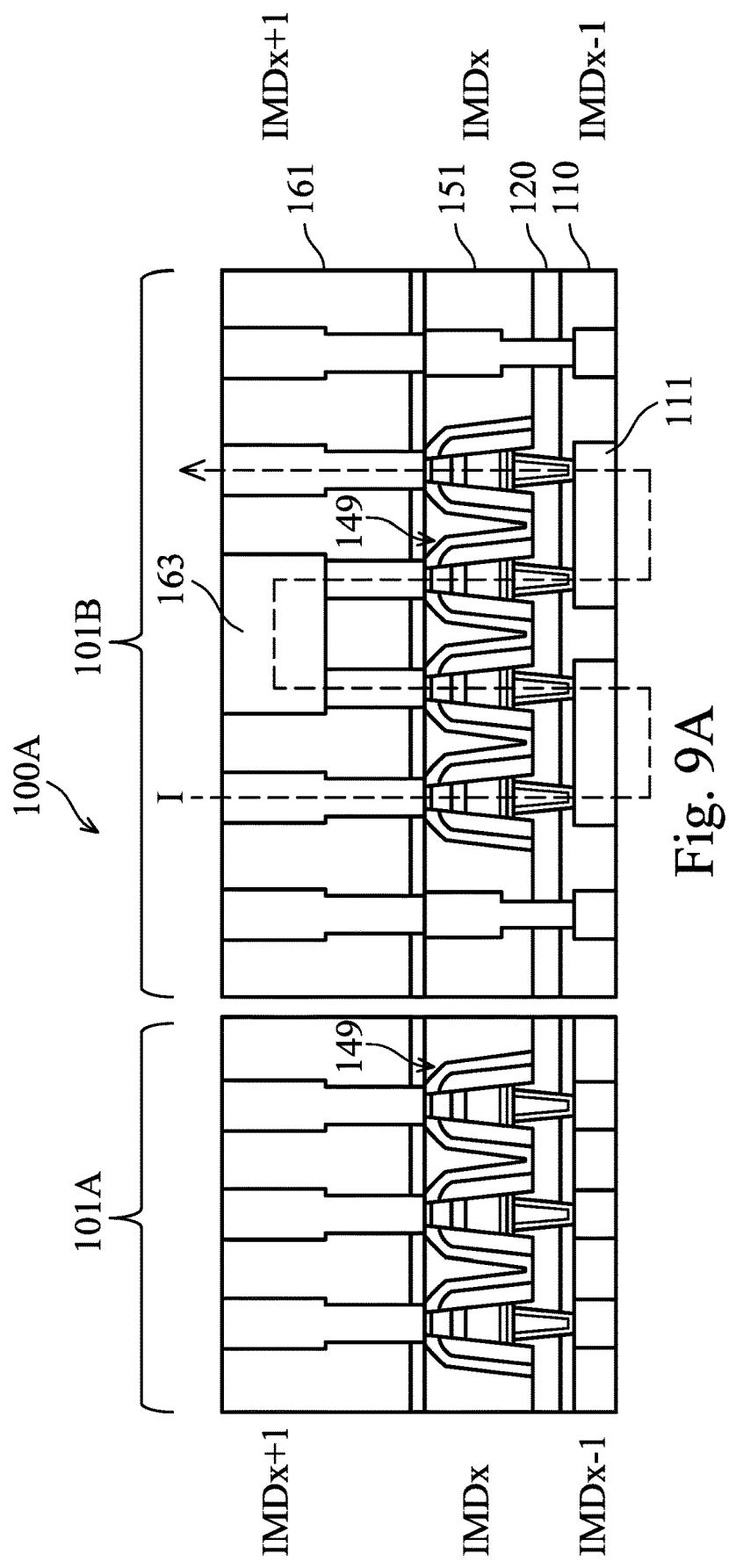
FIG. 9A illustrates a cross-sectional view of a semiconductor device comprising a resistor device, in accordance with an embodiment.

FIG. 9A illustrates a semiconductor device 100A, which is similar to the semiconductor device 100 of FIG. 7, but with multiple MTJ structures 149 in the logic region 101B. The MTJ structures 149 in the logic region 101B function as resistors, and are electrically coupled in series to form a resistor device and to provide a larger equivalent resistance. The MTJ structures 149 in the logic region 101B are connected in a head-to-head series configuration, where an electrical current flowing out of an MTJ structure 149 flows into an adjacent MTJ structure 149 through a same type of electrode (e.g., a top electrode, or a bottom electrode). In other words, if the electrical current flows out of an MTJ structure at a bottom electrode, it will flow into an adjacent MTJ structure at a bottom electrode of the adjacent MTJ structure, and vice versa. In the example of FIG. 9A, the bottom vias of the MTJ structures 149 in the logic region 101B are directly coupled to conductive features 111 in an underlying IMD layer (e.g., the IMD layer $IMD_{x-1}$), and the top electrode of the MTJ structures 149 are directly coupled to conductive features 163 in an overlying IMD layer (e.g., the IMD layer $IMD_{x+1}$). In some embodiments, the conductive feature 111 is a conductive line. In some embodiments, the conductive feature 111 is a via that is wide enough such that two adjacent MTJ structures 149 can land on (e.g., directly connected to) the via.

FIG. 9A also illustrates an electrical current I (see dashed arrowed lines) that flows through the MTJ structures 149 of the resistor device. As illustrated in FIG. 9A, the internal current flow directions of the MTJ structures 149 in the resistor device are different, where the internal current flow direction of an MTJ structure refers to how a current flows through an MTJ structure (e.g., from the top electrode to the bottom electrode, or from the bottom electrode to the top electrode). In particular, if the MTJ structures 149 of the resistor device in the logic region 101B are sequentially assigned numbers such as 1, 2, 3, and 4 from the left to the right, then, due to the head-to-head series configuration, the current I flows through the odd-numbered MTJ structures 149 from the top electrode to the bottom electrode (or to the bottom via), and flows through the even-numbered MTJ structures 149 from the bottom electrode to the top electrode. The different internal current flow directions of the MTJ structures 149 in the head-to-head series configuration will be exploited to program the multi-level resistance of the resistor device, as discussed hereinafter with reference to FIGS. 16A, 16B, and 17.

Figure 9B:
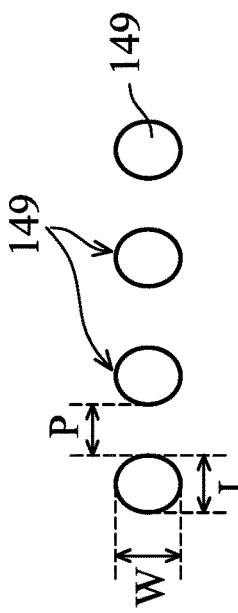
FIG. 9B illustrates a layout of the resistor device illustrated in FIG. 9A, in accordance with an embodiment.

FIG. 9B illustrates the layout design of the MTJ structures 149 in the logic region 101B of FIG. 9A. Each of the MTJ structure 149 has a cell size of L by W, and a distance P between adjacent MTJ structures. Note that although four MTJ structures 149 are illustrated in the logic region 101B, more or less than four MTJ structure may be coupled in the head-to-head series configuration to form the resistor device.

Referring back to the example above, assuming that each MTJ structure 149 in the logic region 101B provides a resistance of $R_0$, and ten MTJ structures 149 are connected in the head-to-head series configuration to provide an equivalent resistance of $10R_0$. In addition, consider the example where the cell size of the MTJ structure is 40 nm by 40 nm (e.g., L=W=40 nm), and the distance P between MTJ structures is 100 nm. The total area used by the ten MTJ structures 149 is therefore (10×40+100×9) nm×40 nm=52000 nm$^2$=0.052 μm$^2$. Compared with a total area of 0.8 μm$^2$ for the reference design using ten sheet type resistors 801 (see FIG. 8B), the presently disclosed method using MTJ structure 149 as integrated resistors uses only 6.5% of the total area of the sheet type resistors, thus achieving a 93.5% reduction in the total area used for the resistor device. This allows for a much higher integration density of the semiconductor device 100.

Figure 10:
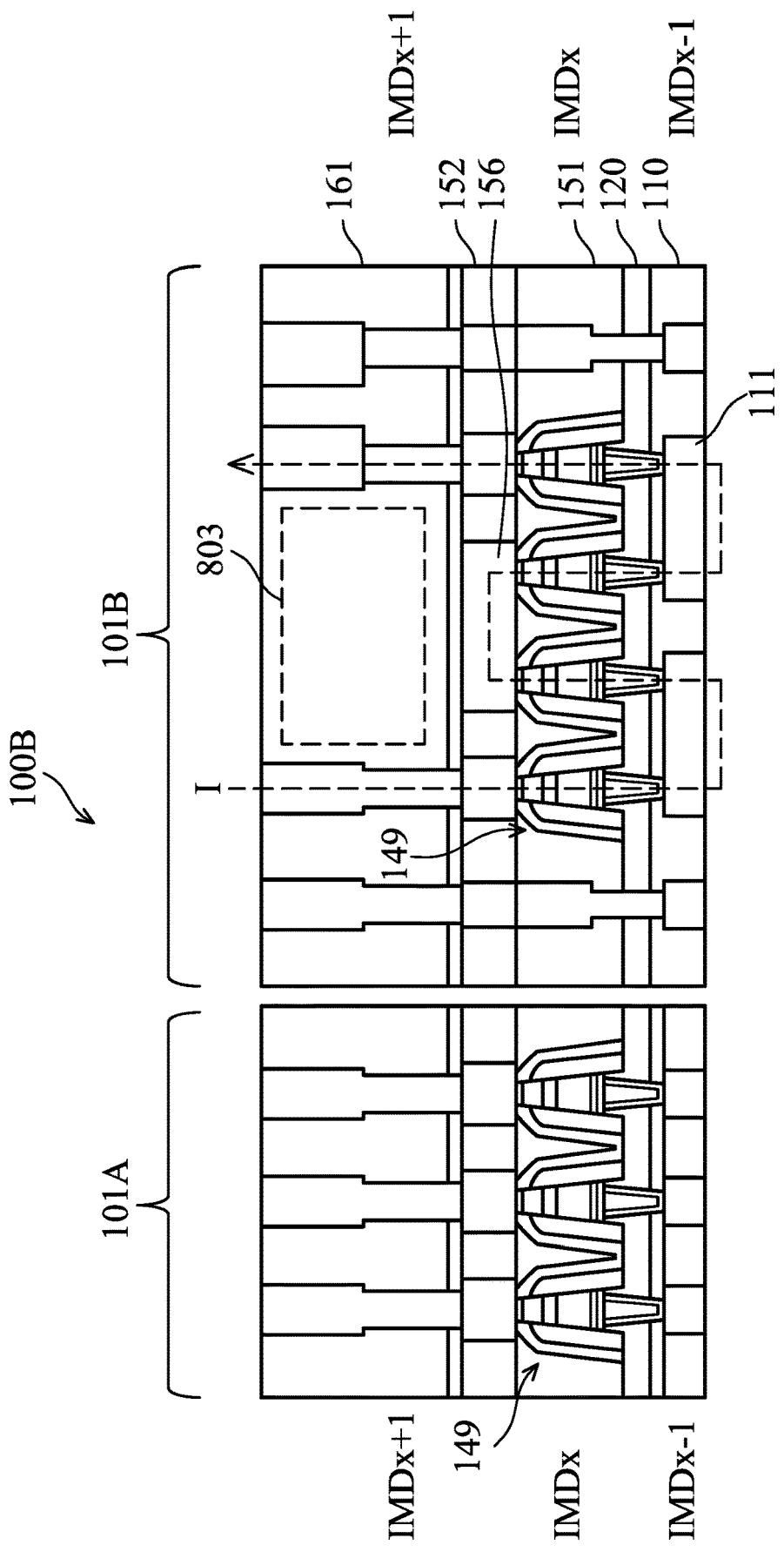
FIG. 10 illustrates a cross-sectional view of a semiconductor device, in accordance with an embodiment.

FIG. 10 illustrates a semiconductor device 100B, which is similar to the semiconductor device 100A of FIG. 9A, where the MTJ structures 149 in the logic region 101B are electrically connected in a head-to-head series configuration. The top electrodes of the MTJ structures 149 in the logic region 101B of FIG. 10, however, are directly coupled to conductive features 156 over the MTJ structures 149, which conductive features 156 are formed in the same IMD layer (e.g., IMD$_x$) as the MTJ structures 149. The embodiment of FIG. 10 is suitable for applications where the IMD layer IMD$_x$ is thick enough to accommodate the conductive features 156. The conductive features 156 may be formed by forming a dielectric layer 152 over the MTJ structures 149 and over the dielectric layer 151, then forming the conductive features 156 in the dielectric layer 152. Note that in the example of FIG. 10, the IMD layer IMD$_x$ includes the dielectric layers 152, 151, and 120.

In the embodiment of FIG. 10, since the conductive features (e.g., 156) used to connect the top electrodes of the MTJ structures 149 are formed in the IMD layer IMD$_x$, the IMD layer IMD$_{x+1}$ has an area 803 over the MTJ structures 149 which is now un-occupied by, e.g., the conductive features 163 (see FIG. 9A). In some embodiments, the extra space provided by the area 803 may be used to route conductive lines in the IMD layer IMD$_{x+1}$ to save the total layout area of the semiconductor device 100 and/or to increase integration density.

Figure 11:
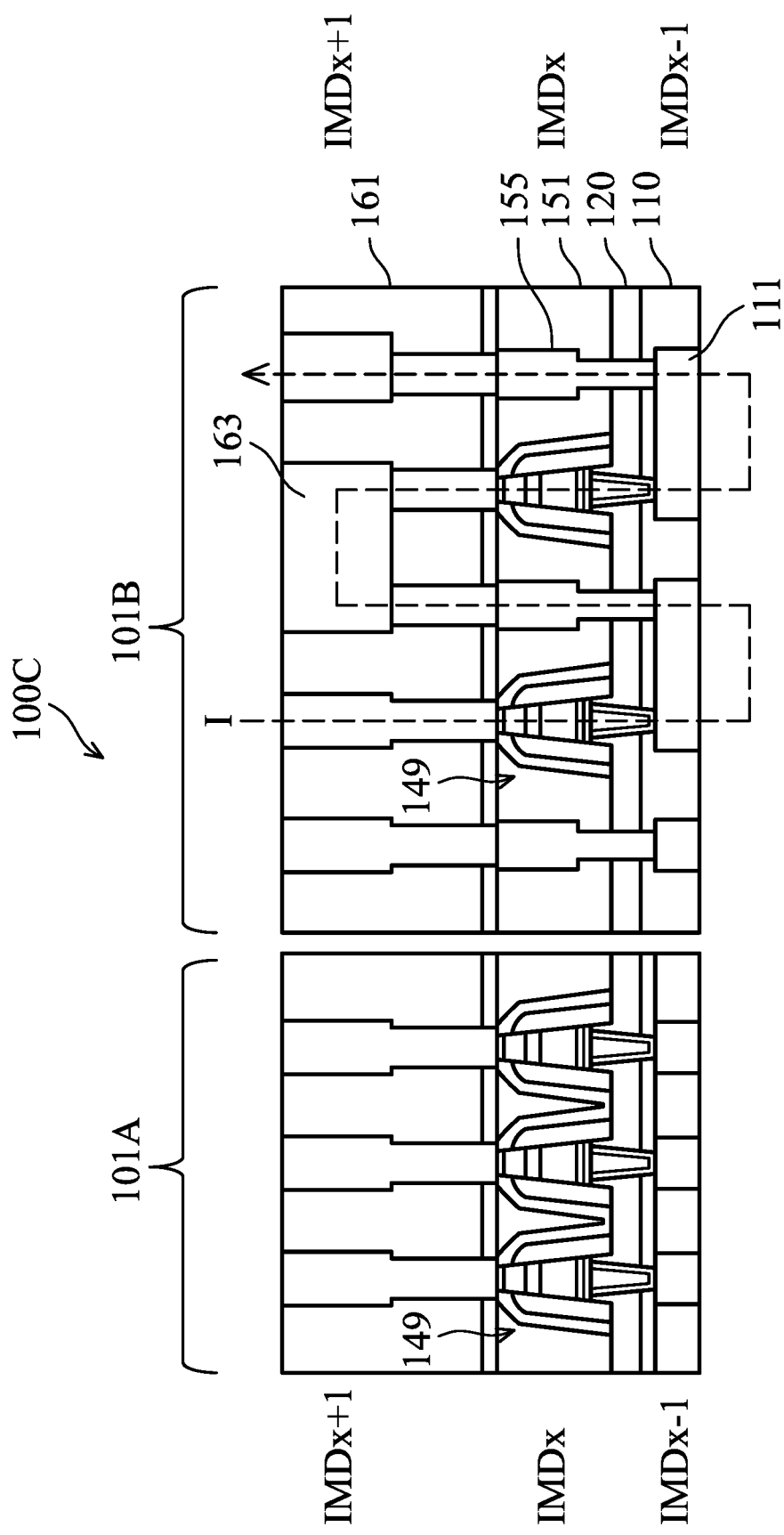
FIG. 11 illustrates a cross-sectional view of a semiconductor device, in accordance with an embodiment.

FIG. 11 illustrates a semiconductor device 100C, which is similar to the semiconductor device 100A of FIG. 9A, with the MTJ structures 149 in the logic region 101B connected in series to provide an equivalent resistance. In particular, the MTJ structures 149 in the logic region 101B of FIG. 11 are connected in a head-to-tail series configuration, where the top electrode of an MTJ structure 149 is directly coupled to (e.g., having a same voltage as) the bottom via of a preceding MTJ structure 149 in the head-to-tail series configuration. Therefore, the internal current flow directions of the MTJ structures 149 in the head-to-tail series configuration are the same, e.g., from the top electrode to the bottom electrode, or from the bottom electrode to the top electrode.

Figure 12:
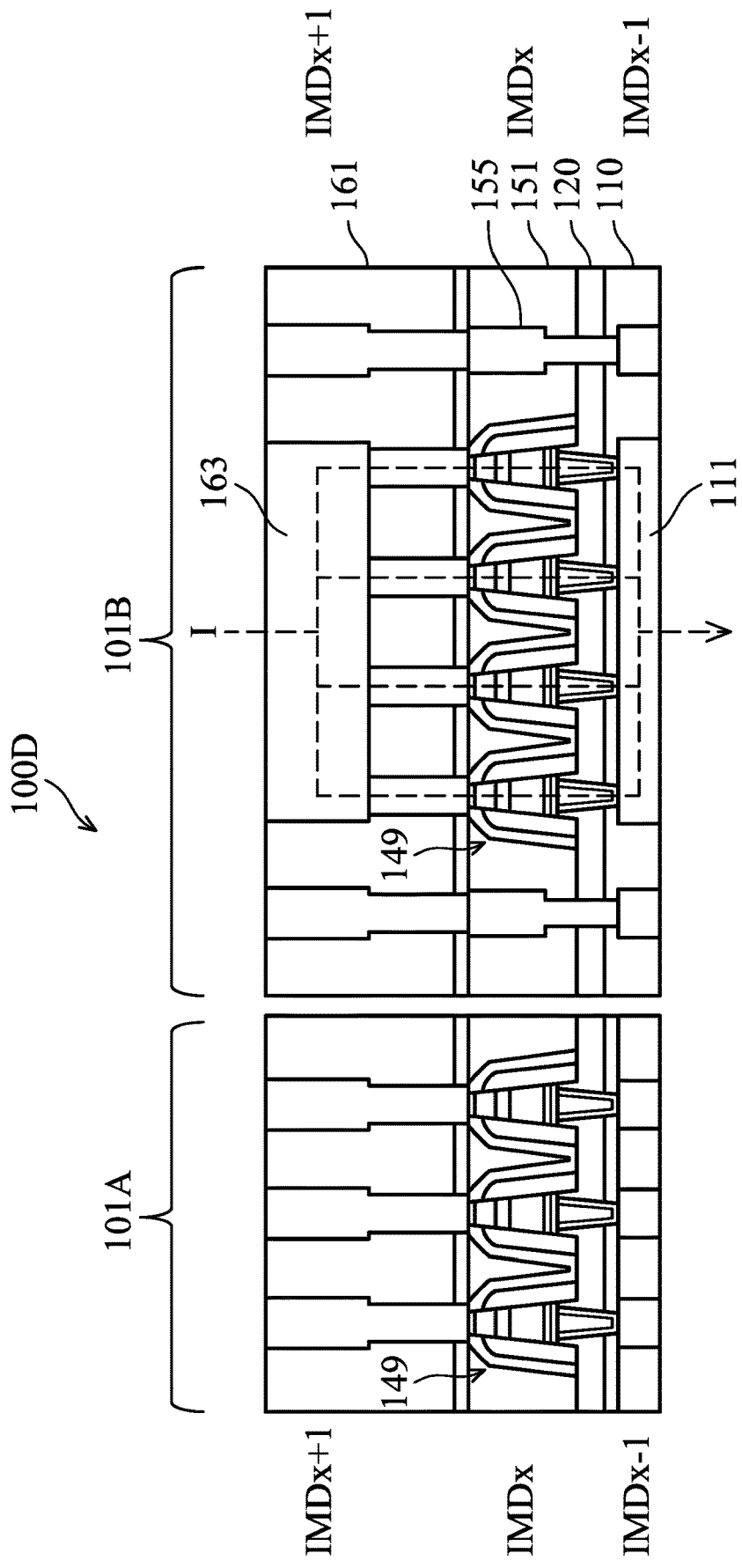
FIG. 12 illustrates a cross-sectional view of a semiconductor device, in accordance with an embodiment.

FIG. 12 illustrates a semiconductor device 100D, which has multiple MTJ structures 149 in the logic region 101B that are electrically coupled in parallel to provide an equivalent resistance. In some embodiments, the MTJ structures 149 are formed in a same process and have substantially a same resistance value $R_a$ individually, and the equivalent resistance provided by the parallel connected MTJ structures 149 is $R_a/N$, where N is the number of parallel connected MTJ structures. In embodiments where the IMD layer IMD$_x$ is thick enough to accommodate a conductive features (see, e.g., 156 in FIG. 10) over and connecting all the MTJ structures 149, an un-occupied space (see, e.g., 803 in FIG. 10) over the MTJ structures 149 in the IMD layer IMD$_{x+1}$ may be formed, similar to FIG. 10.

FIG. 13 illustrates a schematic view of a memory array 1300, in accordance with an embodiment. The memory array 1300 includes a plurality of MTJ structures 149 and may be formed in the memory region 101A of, e.g., the semiconductor device 100 of FIG. 7. In FIG. 13, each of the MTJ structures 149 is illustrated as a free layer FL and a corresponding pinned layer PL for simplicity. As illustrated in FIG. 13, the memory array 1300 includes MTJ structures 149 organized in an array (e.g., in rows and columns), and has bit lines (e.g., BL0, BL1), word lines (e.g., WL0, WL1), and common sensing lines (e.g., CSL). Each of the MTJ structures 149 is coupled between a bit line and a drain of a corresponding transistor 1311. A gate of the transistor 1311 is coupled to a word line, and a source of the transistor 1311 is coupled to a common sensing line. When a transistor 1311 is turned on, a current flowing through the drain and the source of the transistor 1311 is determined by the resistance of the MTJ structure 149 (e.g., a high resistance Rap or a low resistance Rp), and the current is used to determine whether a zero or a one is stored in the MTJ structure 149. In the example of FIG. 13, four bits are stored by the four MTJ structures 149. One skilled in the art will readily appreciate that the memory array 1300 may include more MTJ structures 149 than illustrated in FIG. 13 to store a pre-determined amount of data bits.

FIG. 14 illustrates a schematic cross-sectional view of the memory array 1300 of FIG. 13, in accordance with an embodiment. For simplicity, FIG. 14 illustrates only a portion of the memory array 1300. The area 1380 in FIG. 14 corresponds to the area 1380 in FIG. 13.

As illustrated in FIG. 14, source regions S and drain regions D of transistors are formed over the substrate 101. Gate structures PO and source/drain contacts MD are formed over the substrate 101 in the ILD layer. A plurality of IMD layers (e.g., $IMD_0$~$IMD_6$) are formed over the ILD layer, with each IMD layer having conductive lines (e.g., $M_{XH}$ or $M_{XV}$, where x=0, 1, 2, . . . , 6) and vias (e.g., VD, or $V_0$~$V_5$) formed therein. In some embodiments, the conductive lines $M_{XH}$ and $M_{XV}$ extend perpendicular to each other, with the $M_{XH}$ lines extending along a first direction and the $M_{XV}$ lines extending along a second direction perpendicular to the first direction, where the first direction and the second direction define a plane that is parallel to the upper surface of the substrate 101. In some embodiments, depending on the design of the circuit, the conductive lines $M_{XH}$ and $M_{XV}$ extend along a same direction in a plane that is parallel to the upper surface of the substrate 101.

In the example of FIG. 14, the MTJ structure 149 is formed in the IMD layer IMD5. The MTJ structure 149 illustrated in FIG. 14 is a simplified schematic view of the MTJ structure 149 shown in FIG. 4. For example, the MTJ structure 149 illustrated in FIG. 14 shows the MTJ 137 of FIG. 4, a BEVA (which includes the bottom via 123 and the bottom electrode 132 in FIG. 4), and a TEVA (which includes the top electrode 142 in FIG. 4). The word lines WL (e.g., WL0, WL1) of the memory array are formed in the IMD layer IMD1, the common sensing lines CSL are formed in the IMD layer IMD0, and the bit lines BL (e.g., BL0, BL1) are formed in the IMD layer IMD6. These are, of course, merely examples and non-limiting. The word lines, bit lines, common sensing lines may be formed in other IMD layers, these and other variations are fully intended to be included within the scope of the present disclosure.

Figure 15B:
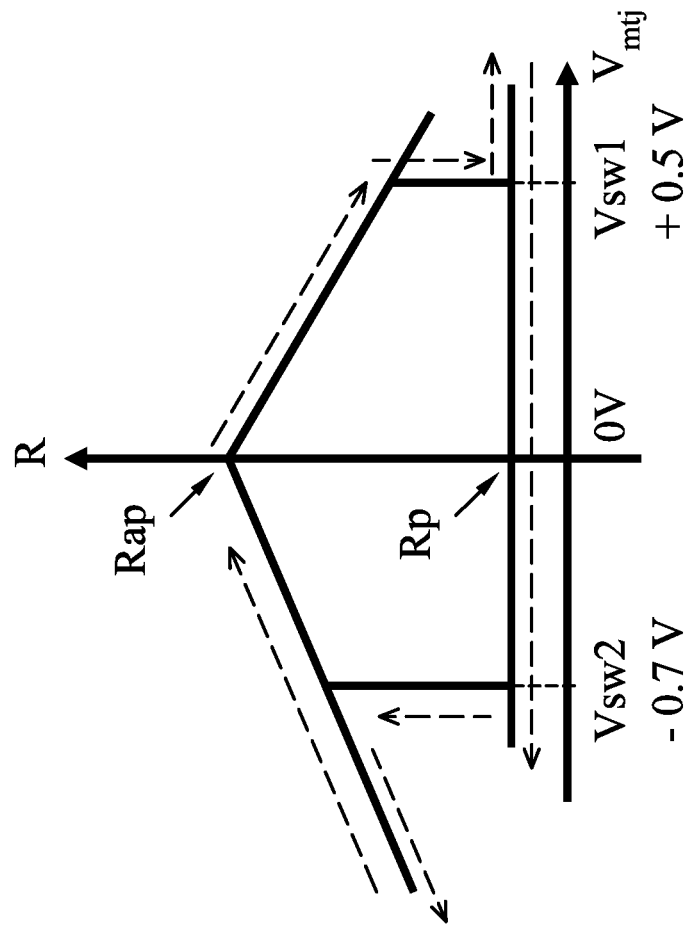
FIG. 15B illustrates the operating characteristics of an MTJ, in some embodiments.
Figure 15A:
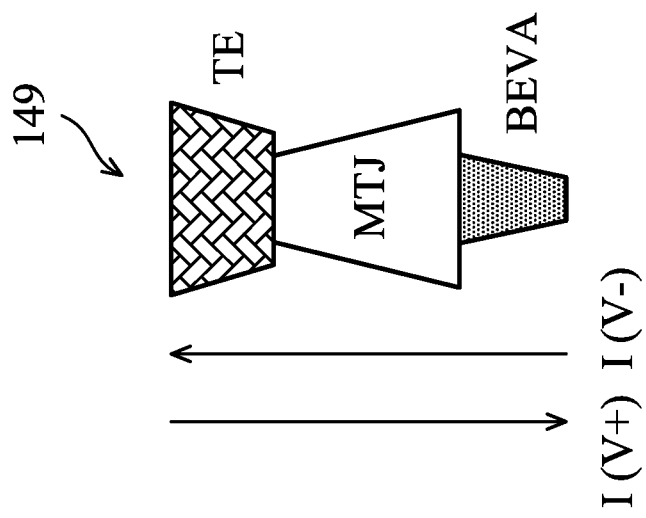
FIG. 15A illustrates internal current flow directions of an MTJ, in some embodiments.

FIG. 15A illustrates the internal current flow directions of an MTJ structure 149. The MTJ structure 149 of FIG. 15A is a simplified schematic view, which includes a MTJ (e.g., 137 of FIG. 4), a BEVA (e.g., including the bottom electrode 132 and the bottom via 123 of FIG. 4), and a TE (e.g., including the top electrode 142 of FIG. 4). The shapes of the MTJ, BEVA, and the TE in FIG. 15A are merely non-limiting examples, other suitable shapes are also possible and are fully intended to be included within the scope of the present disclosure. A positive internal current flow direction I(V+) refers to a direction of current flow inside the MTJ structure from the top electrode TE to the bottom via BEVA, and a negative internal current flow direction I(V−) refers to a direction of current flow inside the MTJ structure from the bottom via BEVA to the top electrode TE. Similarly, a positive voltage applied to the MTJ structure refers to a voltage that causes a positive internal current flow direction for the MTJ structure, and a negative voltage applied to the MTJ structure refers to a voltage that causes a negative internal current flow direction for the MTJ structure. Discussion below may refer to the positive/negative internal current flow directions and the positive/negative voltages of the MTJ structures.

FIG. 15B illustrates the operating characteristics of an MTJ structure 149, in some embodiments. The x-axis corresponds to the voltage applied to the MTJ structure 149, and the y-axis corresponds to the resistance of the MTJ structure. The MTJ structure 149 has two resistance states, such as the anti-parallel state (e.g., a high-resistance state) which corresponds to a high resistance value Rap, and the parallel state (e.g., a low-resistance state) which corresponds to the low resistance Rp. Transition of the MTJ structure 149 between the anti-parallel state and the parallel state may be achieved by applying positive/negative voltages, or positive/negative currents, through the MTJ structure 149, details of which are discussed below.

Referring to FIG. 15B, the MTJ structure 149 may be initialized (e.g., after being formed) to be in the anti-parallel state. This may be achieved by, e.g., using a magnetic field to set the magnetic moment spin direction of the free layer to be opposite to that of the pinned layer. To switch from the anti-parallel state to the parallel state, a positive voltage is applied to the MTJ structure. As illustrated in FIG. 15B, when the positive voltage is larger than zero volt but smaller than a first threshold voltage $V_{sw1}$ (e.g., +0.5V), the MTJ structure stays in the anti-parallel state. When the positive voltage reaches the threshold voltage $V_{sw1}$, the MTJ switches from the anti-parallel state into the parallel state, and the resistance of the MTJ structure 149 drops from Rap to Rp. Once the MTJ structure 149 switches into the parallel state, it stays in the parallel state as long as the voltage applied to the MTJ structure is above a second threshold voltage $V_{sw2}$ (e.g., −0.7V). When the voltage applied to the MTJ structure 149 drops to the second threshold voltage $V_{sw2}$, the MTJ structure switches into the anti-parallel state. Once the MTJ structure 149 switches into the anti-parallel state, it stays in the anti-parallel state as long as the voltage applied to the MTJ structure 149 is below the first threshold voltage $V_{sw1}$. The MTJ structure 149 has a positive break-down voltage that is higher than $V_{sw1}$, and a negative break-down voltage that is lower than $V_{sw2}$. The discussion above assumes that the voltage applied to the MTJ structure 149 is between the negative break-down voltage and the positive break-down voltage, as one skilled in the art readily appreciates.

Figure 16A:
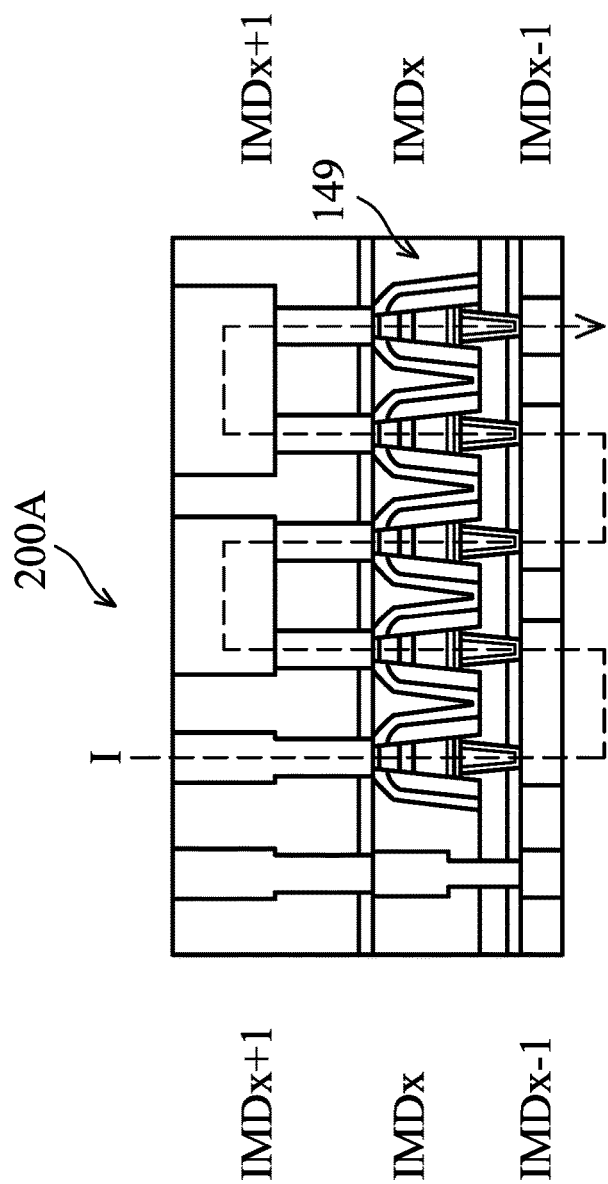
FIG. 16A illustrates a cross-sectional view of a resistor circuit comprising MTJs, in accordance with an embodiment.
Figure 16B:
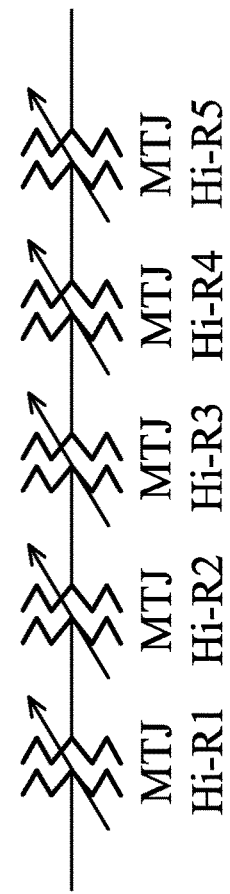
FIG. 16B illustrates a schematic view of the resistor circuit in FIG. 16A, in an embodiment.

FIG. 16A illustrates a cross-sectional view of a resistor circuit 200A comprising MTJs, in accordance with an embodiment. The resistor circuit 200A may be formed in the logic region 101B of, e.g., the semiconductor device 100A. As illustrated in FIG. 16A, the resistor circuit 200A includes five MTJ structures 149 connected in the head-to-head series configuration. FIG. 16B illustrates an equivalent schematic view of the resistor circuit 200A in FIG. 16A, where the five MTJ structures from the left to the right of FIG. 16A are referred to as resistors Hi-R1~Hi-R5, respectively.

Since each of the MTJ structure 149 has two different resistance values (e.g., Rap and Rp) corresponding to two different states (e.g., anti-parallel state and parallel state), setting the MTJ structures 149 of the resistor circuit 200A to different states results in a plurality of resistance values for the resistor circuit 200A. In some embodiments, a pre-determined sequence of electrical currents is applied to the resistor circuit 200A to set the equivalent resistance of the resistor circuit 200A to different values. In other words, the resistor circuit 200A provides a multi-level resistance (e.g., having a plurality of resistance values) that is programmable by applying a pre-determined sequence of electrical currents (or a pre-determined sequence of voltages), details of which are discussed hereinafter. Note that although details regarding programming the equivalent resistance of the resistor circuit 200A is discussed below in the context of applying a pre-determined sequence of electrical currents, one skilled in the art will readily appreciate that the programming of the equivalent resistance may also be achieved by applying a corresponding pre-determined sequence of voltages, since the MTJ structures 149 function as resistors, and the voltage across a resistor is proportional to the current flowing through the resistor.

FIG. 17 illustrates a method of programming the equivalent resistance of the resistor circuit 200A of FIG. 16A, in an embodiment. In particular, a sequence of electrical currents is supplied to the resistor circuit 200A to set the equivalent resistance of the resistor circuit 200A to different values. The discussions below with reference to FIGS. 17 and 19 assume that the operating characteristics of the MTJ structures 149 are the same as those illustrated in FIG. 15B, and that Rap is twice of Rp (e.g., Rap=2Rp). One skilled in the art, upon reading the discussions herein, will be able to apply the principles discussed herein to other MTJ structures with other operating characteristics and/or other relations between Rap and Rp.

Referring to FIG. 17, the five MTJ structures 149 (referred to as resistors Hi-R1~Hi-R5 in FIG. 17) are initialized in the anti-parallel state and have initial resistance values Rap. Therefore, a total resistance $R_{total}$ (or the equivalent resistance) of the resistor circuit 200A after initialization is 5×Rap=10Rp.

Next, in step 1), a first electrical current having a same direction as that of the current I illustrated in FIG. 16A (see the dashed arrowed line) is applied to the resistor circuit 200A. Due to the head-to-head configuration of the resistor circuit 200A, the first electrical current results in a positive voltage across each of the odd-numbered MTJ structures 149 (e.g., Hi-R1, Hi-R3, Hi-R5), and results in a negative voltage across each of the even-numbered MTJ structures 149 (e.g., Hi-R2, Hi-R4). In the example of FIG. 17, the first electrical current has a pre-determined value such that the voltage across each of the odd-numbered MTJ structures 149 has a pre-determined value of +0.6V, and the voltage across each of the even-numbered MTJ structures 149 has a pre-determined value of −0.6V. Since the voltage of +0.6V is larger than the first threshold voltage $V_{sw1}$ (e.g., +0.5V), the odd-numbered MTJ structures 149 switch from the anti-parallel state into the parallel state (see FIG. 15B) and have the low resistance Rp. The even-numbered MTJ structures 149, however, stays in the anti-parallel state, because the voltage across the even-numbered MTJ structures 149 (e.g., −0.6V) is still above the second threshold voltage $V_{sw2}$ (e.g., −0.7V). Therefore, the resistor circuit 200A now has three MTJ structures with resistance Rp and two MTJ structures with resistance Rap. Accordingly, the total resistance of the resistor circuit 200A at step 1) is 3×Rp+2×Rap=7Rp.

Next, in step 2), a second electrical current is supplied to the resistor circuit 200A, which second electrical current flows in a direction opposite to that of the current I illustrated in FIG. 16A. The second electrical current has a pre-determined value, and causes a voltage drop of −0.6V across each of the odd-numbered MTJ structures 149 and a voltage drop of +0.6V across each of the even-numbered MTJ structures 149. As a result, the even-numbered MTJ structures 149 switch from the anti-parallel state into the parallel state, and the odd-numbered MTJ structures 149 stay in the parallel state. Therefore, the total resistance of the resistor circuit 200A at step 2) is 5Rp.

Next, in step 3), a third electrical current having a same direction as the second electrical current but a larger current value is applied to the resistor circuit 200A. The third electrical current has pre-determined current value, which causes a voltage drop of −0.8V across each of the odd-numbered MTJ structures 149 and a voltage drop of +0.8V across each of the even-numbered MTJ structures 149. As a result, the odd-numbered MTJ structures 149 switch from the parallel state into the anti-parallel state, and the even-numbered MTJ structures 149 stay in the parallel state. Therefore, the total resistance of the resistor circuit 200A at step 3) is 3×Rap+2×Rp=8Rp.

Next, in step 4), a fourth electrical current having a same direction as the electrical current I illustrated in FIG. 16A is applied to the resistor circuit 200A. The fourth electrical current has a pre-determined value, which causes a voltage drop of +0.6V across each of the odd-numbered MTJ structures 149 and a voltage drop of −0.6V across each of the even-numbered MTJ structures 149. As a result, the odd-numbered MTJ structures 149 switch from the anti-parallel state into the parallel state, and the even-numbered MTJ structures 149 stay in the parallel state. Therefore, the total resistance of the resistor circuit 200A at step 4) is 5Rp.

Next, in step 5), a fifth electrical current having a same direction as the electrical current I illustrated in FIG. 16A is applied to the resistor circuit 200A. The fifth electrical current has a pre-determined value, which causes a voltage drop of +0.8V across each of the odd-numbered MTJ structures 149 and a voltage drop of −0.8V across each of the even-numbered MTJ structures 149. As a result, the odd-numbered MTJ structures 149 stay in the parallel state, and the even-numbered MTJ structures 149 switch from the parallel state to the anti-parallel state. Therefore, the total resistance of the resistor circuit 200A at step 5) is 3×Rp+2×Rap=7Rp.

Next, in step 6), a sixth electrical current having a direction opposite to that of the electrical current I illustrated in FIG. 16A is applied to the resistor circuit 200A. The sixth electrical current has a pre-determined value, which causes a voltage drop of −0.6V across each of the odd-numbered MTJ structures 149 and a voltage drop of +0.6V across each of the even-numbered MTJ structures 149. As a result, the odd-numbered MTJ structures 149 stay in the parallel state, and the even-numbered MTJ structures 149 switch from the anti-parallel state to the parallel state. Therefore, the total resistance of the resistor circuit 200A at step 6) is 5Rp.

As discussed above, by applying the sequence of electrical currents, the equivalent resistance of the resistor circuit 200A in FIG. 16A may have four different values, such as 10Rp, 8Rp, 7Rp, and 5Rp. A user may program the resistor circuit 200A by applying the sequence of electrical currents described above and stop at any of the steps discussed above to obtain the corresponding equivalent resistance at that step.

Figure 18A:
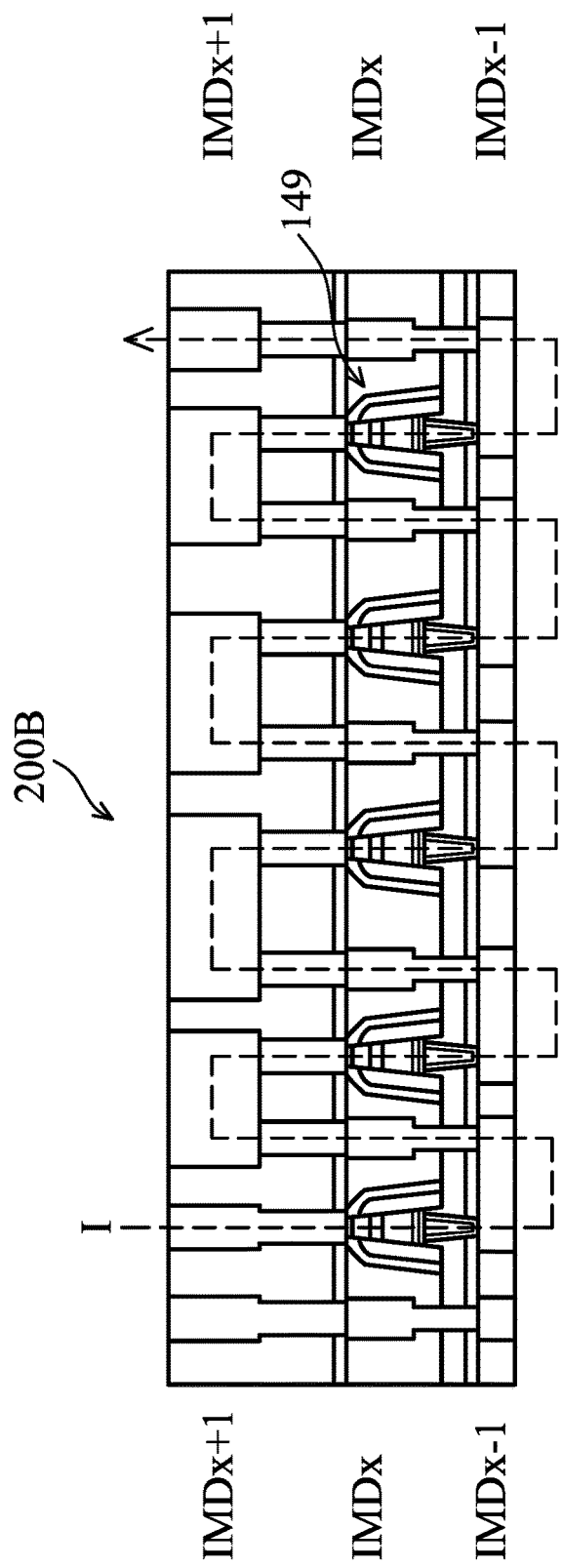
FIG. 18A illustrates a cross-sectional view of a resistor circuit comprising MTJs, in accordance with an embodiment.
Figure 18B:
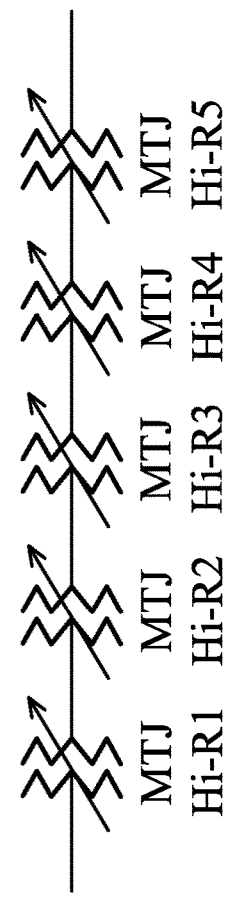
FIG. 18B illustrates a schematic view of the resistor circuit in FIG. 18A, in an embodiment.

FIG. 18A illustrates a cross-sectional view of a resistor circuit 200B comprising MTJ structures, in accordance with an embodiment. The resistor circuit 200B may be formed in the logic region 101B of, e.g., the semiconductor device 100C. As illustrated in FIG. 18A, the resistor circuit 200B includes five MTJ structures connected in the head-to-tail series configuration. FIG. 18A also illustrates an electrical current I (see dashed arrowed line) that flows through the MTJ structures 149 of the resistor circuit 200B. Note that due to the head-to-tail configuration, the internal current flow directions of the MTJ structures 149 are the same. FIG. 18B illustrates an equivalent schematic view of the resistor circuit 200B in FIG. 18A, where the five MTJ structures from the left to the right of FIG. 18A are referred to as resistors Hi-R1~Hi-R5, respectively.

FIG. 19 illustrates a method of programming the equivalent resistance of resistor circuit 200B of FIG. 18A, in an embodiment. Referring to FIG. 19, the five MTJ structures 149 (referred to as resistors Hi-R1~Hi-R5 in FIG. 19) are initialized in the anti-parallel state and have initial resistance values Rap. Therefore, a total resistance $R_{total}$ (or the equivalent resistance) of the resistor circuit 200B after initialization is 5×Rap=10Rp.

Next, in step 1), a first electrical current having a same direction as the current I illustrated in FIG. 18A (see the dashed arrowed line) is applied to the resistor circuit 200B. Due to the head-to-tail configuration of the resistor circuit 200B, the first electrical current results in a positive voltage across each of the MTJ structures 149. In the example of FIG. 19, the first electrical current has a pre-determined value such that the voltage across each of the MTJ structures 149 has a pre-determined value of, e.g., +0.6V. Since the voltage of +0.6V is larger than the first threshold voltage $V_{sw1}$ (e.g., +0.5V), the MTJ structures 149 switch from the anti-parallel state into the parallel state (see FIG. 15B) and have the low resistance Rp. Therefore, the total resistance of the resistor circuit 200B at step 1) is 5Rp.

Next, in step 2), a second electrical current is supplied to the resistor circuit 200B, which second electrical current flows in a direction opposite to that of the current I illustrated in FIG. 18A. The second electrical current has a pre-determined value, and causes a voltage drop of −0.6V across each of the MTJ structures 149. Since the voltage −0.6V is still above the second threshold $V_{sw2}$ (e.g., −0.7V), the MTJ structures 149 stay in the parallel state. Therefore, the total resistance of the resistor circuit 200B at step 2) is still 5Rp.

Next, in step 3), a third electrical current is supplied to the resistor circuit 200B. The third electrical current flows in a same direction as the second electrical current but has a larger value, such that a voltage drop of −0.8V is achieved across each of the MTJ structures 149. Since the voltage −0.8V is below the second threshold $V_{sw2}$ (e.g., −0.7V), the MTJ structures 149 switch from the parallel state into the anti-parallel state. Therefore, the total resistance of the resistor circuit 200B at step 3) is 5×Rap=10Rp.

Next, in step 4), a fourth electrical current is supplied to the resistor circuit 200B. The fourth electrical current flows in a same direction as the current I illustrated in FIG. 18A, and causes a voltage drop of +0.6V across each of the MTJ structures 149. Since the voltage +0.6V is above the first threshold $V_{sw1}$ (e.g., +0.5V), the MTJ structures 149 switch from the anti-parallel state into the parallel state. Therefore, the total resistance of the resistor circuit 200B at step 4) is 5Rp.

As discussed above, by applying the sequence of electrical currents, the equivalent resistance of the resistor circuit 200B in FIG. 18A may have two different values, such as 10Rp and 5Rp. A user may program the resistor circuit 200B by applying the sequence of electrical currents described above and stop at any of the steps discussed above to obtain the corresponding equivalent resistance at that step.

Figure 20:
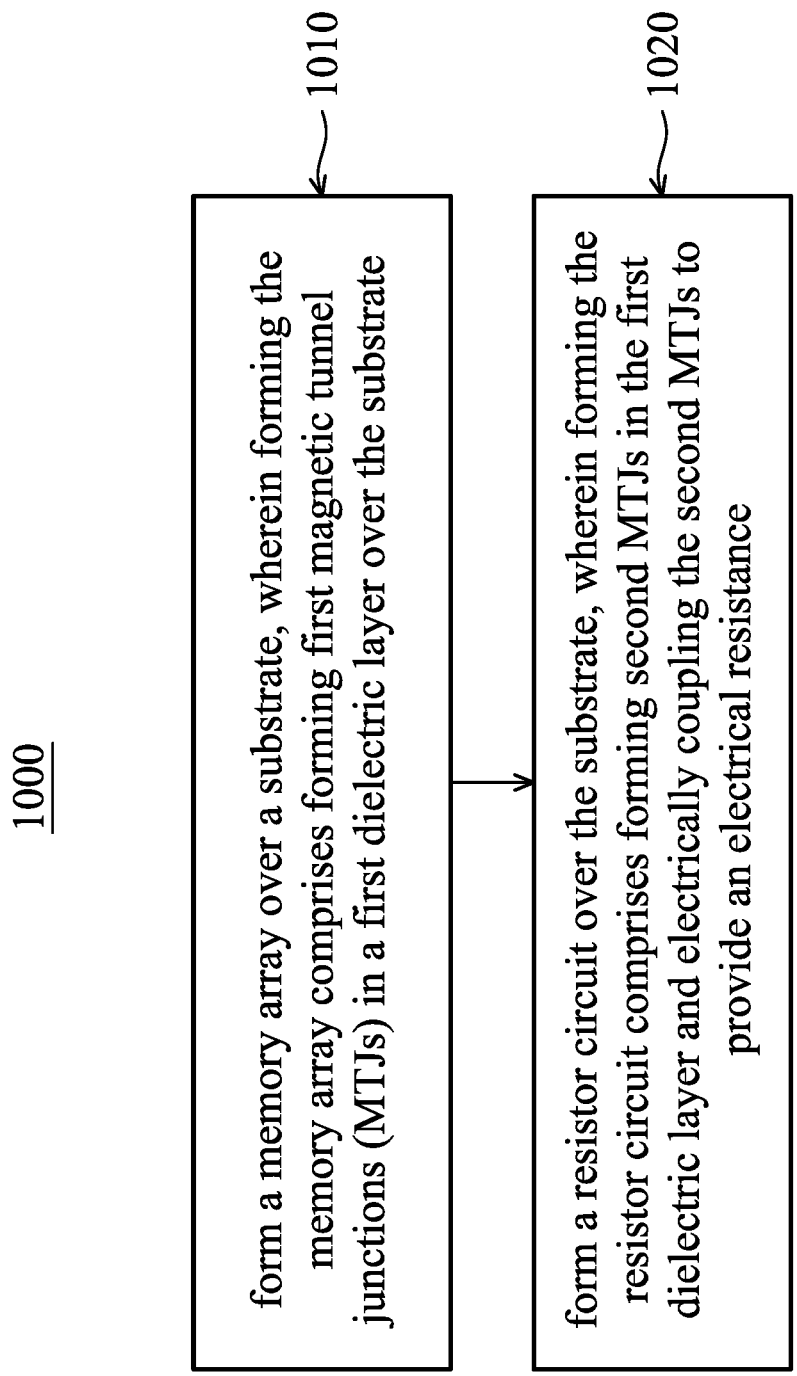
FIG. 20 illustrates a flow chart for a method of forming a semiconductor device, in some embodiments.

FIG. 20 illustrates a flow chart for a method 1000 of forming a semiconductor device, in some embodiments. It should be understood that the embodiment method shown in FIG. 20 is merely an example of many possible embodiment methods. One of ordinary skill in the art would recognize many variations, alternatives, and modifications. For example, various steps as illustrated in FIG. 20 may be added, removed, replaced, rearranged and repeated.

Referring to FIG. 20, at step 1010, a memory array is formed over a substrate, wherein forming the memory array comprises forming first magnetic tunnel junctions (MTJs) in a first dielectric layer over the substrate. At step 1020, a resistor circuit is formed over the substrate, wherein forming the resistor circuit comprises forming second MTJs in the first dielectric layer and electrically coupling the second MTJs to provide an electrical resistance.

Variations to the disclosed embodiments are possible and are fully intended to be included within the scope of the present disclosure. For example, five MTJ structures are illustrated in FIGS. 16A and 18A as examples. More or less than five MTJ structures may be used in the resistor circuit (e.g., 200A, 200B). In addition, while the head-to-head series configuration, the head-to-tail series configurations, and the parallel configuration are illustrated separately in different examples, a resistor circuit formed using the present disclosure may include MTJ structures coupled in any suitable combinations, such as combinations of the head-to-head series configuration, the head-to-tail series configuration, and the parallel configuration. These and other variations are fully intended to be included within the scope of the present disclosure.

Embodiment may achieve advantages. For example, by using MTJ devices as resistors, and by forming the MTJ resistor devices in a same metal layer as the MTJ memory devices, the disclosed embodiments significantly reduce the surface area used for achieving large resistance values, thereby increasing the integration density of the semiconductor device. In addition, since the MTJ resistor devices may be formed in a same processing step as the MTJ memory devices, there is no extra processing steps needed to form the integrated resistors, which reduces production time and cost. Due to its operating characteristics, the MTJ structures may be coupled together to form resistance devices with multi-level resistances, which provides flexibility for the resistance device to be used in different applications.

In accordance with an embodiment, a semiconductor device includes a substrate; a memory array over the substrate, the memory array comprising first magnetic tunnel junctions (MTJs), wherein the first MTJs are in a first dielectric layer over the substrate; and a resistor circuit over the substrate, the resistor circuit comprising second MTJs, wherein the second MTJs are in the first dielectric layer. In an embodiment, the first MTJs and the second MTJs have a same structure. In an embodiment, each of the first MTJs is configured to store a data bit, and each of the second MTJs is configured to function as a resistor. In an embodiment, the first MTJs are configured to store data bits independent of each other, and the second MTJs are electrically coupled together to provide an equivalent resistance for the resistor circuit. In an embodiment, the equivalent resistance is programmable and has a plurality of values. In an embodiment, each of the first MTJs is coupled between a bit line (BL) of the memory array and a drain of a respective transistor of the memory array, wherein a gate of the respective transistor is coupled to a word line (WL) of the memory array, and a source of the respective transistor is coupled to a common sensing line (CSL) of the memory array. In an embodiment, the second MTJs are electrically coupled in series or in parallel. In an embodiment, the gate of the respective transistor is in an interlayer dielectric (ILD) layer over the substrate, the common sensing line is in a first inter-metal dielectric (IMD) layer over and contacting the ILD layer, and the word line is in a second IMD layer over and contacting the first IMD layer. In an embodiment, the second MTJs are in a third IMD layer over the second IMD layer, and the bit line is in a fourth IMD layer over the third IMD layer. In an embodiment, the second MTJs are electrically coupled in series. In an embodiment, the second MTJs are electrically coupled in a head-to-tail configuration such that internal current flow directions of the second MTJs are the same. In an embodiment, the second MTJs are electrically coupled in a head-to-head configuration such that a first internal current flow direction of a first one of the second MTJs is opposite to a second internal current flow direction of a second one of the second MTJs, the second one being adjacent to the first one.

In accordance with an embodiment, a semiconductor device includes a memory array in a memory region of the semiconductor device and comprising first magnetic tunnel junctions (MTJs), wherein the first MTJs are configured to store data bits; and a resistor circuit in a logic region of the semiconductor device and comprising second MTJs that are electrically coupled together to provide an equivalent electrical resistance, wherein the first MTJs and the second MTJs are disposed in a same dielectric layer over a substrate of the semiconductor device. In an embodiment, the first MTJs and the second MTJs have a same structure. In an embodiment, the second MTJs are electrically coupled in series or in parallel. In an embodiment, the equivalent electrical resistance is programmable by supplying a pre-determined sequence of electrical currents through the second MTJs. In an embodiment, at least two electrical currents of the pre-determined sequence of electrical currents flow in opposite directions.

In accordance with an embodiment, a method of forming a semiconductor device includes forming a memory array over a substrate, wherein forming the memory array comprises forming first magnetic tunnel junctions (MTJs) in a first dielectric layer over the substrate; and forming a resistor circuit over the substrate, wherein forming the resistor circuit comprises forming second MTJs in the first dielectric layer and electrically coupling the second MTJs to provide an electrical resistance. In an embodiment, the first MTJs and the second MTJs are formed in a same processing step using same materials. In an embodiment, the method further comprises setting a value of the electrical resistance by supplying a pre-determined sequence of electrical currents through the second MTJs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
a memory array over the substrate, the memory array comprising first magnetic tunnel junctions (MTJs), wherein the first MTJs are in a first dielectric layer over the substrate; and
a resistor circuit over the substrate, the resistor circuit comprising second MTJs, wherein the second MTJs are in the first dielectric layer, wherein each of the first MTJs is coupled between a bit line (BL) of the memory array and a drain of a respective transistor of the memory array, wherein a gate of the respective transistor is coupled to a word line (WL) of the memory array, and a source of the respective transistor is coupled to a common sensing line (CSL) of the memory array.

2. The semiconductor device of claim 1, wherein the first MTJs and the second MTJs have a same structure.

3. The semiconductor device of claim 1, wherein each of the first MTJs is configured to store a data bit, and each of the second MTJs is configured to function as a resistor.

4. The semiconductor device of claim 3, wherein the first MTJs are configured to store data bits independent of each other, and the second MTJs are electrically coupled together to provide an equivalent resistance for the resistor circuit.

5. The semiconductor device of claim 4, wherein the equivalent resistance is programmable and has a plurality of values.

6. The semiconductor device of claim 1, wherein the second MTJs are electrically coupled in series or in parallel.

7. The semiconductor device of claim 1, wherein the gate of the respective transistor is in an interlayer dielectric (ILD) layer over the substrate, the common sensing line is in a first inter-metal dielectric (IMD) layer over and contacting the ILD layer, and the word line is in a second IMD layer over and contacting the first IMD layer.

8. The semiconductor device of claim 7, wherein the second MTJs are in a third IMD layer over the second IMD layer, and the bit line is in a fourth IMD layer over the third IMD layer.

9. The semiconductor device of claim 1, wherein the second MTJs are electrically coupled in series.

10. The semiconductor device of claim 9, wherein the second MTJs are electrically coupled in a head-to-tail configuration such that internal current flow directions of the second MTJs are the same.

11. The semiconductor device of claim 9, wherein the second MTJs are electrically coupled in a head-to-head configuration such that a first internal current flow direction of a first one of the second MTJs is opposite to a second internal current flow direction of a second one of the second MTJs, the second one being adjacent to the first one.

12. A semiconductor device comprising:
a memory array in a memory region of the semiconductor device and comprising first magnetic tunnel junctions (MTJs), wherein the first MTJs are configured to store data bits; and
a resistor circuit in a logic region of the semiconductor device and comprising second MTJs that are electrically coupled together to provide an equivalent electrical resistance, wherein the first MTJs and the second MTJs are disposed in a same dielectric layer over a substrate of the semiconductor device, wherein the equivalent electrical resistance is programmable by supplying a pre-determined sequence of electrical currents through the second MTJs.

13. The semiconductor device of claim 12, wherein the first MTJs and the second MTJs have a same structure.

14. The semiconductor device of claim 12, wherein the second MTJs are electrically coupled in series or in parallel.

15. The semiconductor device of claim 14, wherein the second MTJs are electrically coupled in series, wherein internal current flow directions of two adjacent MTJs are opposite to each other.

16. The semiconductor device of claim 12, wherein each of the first MTJs is coupled between a bit line (BL) of the memory array and a drain of a respective transistor of the memory array, wherein a gate of the respective transistor is coupled to a word line (WL) of the memory array, and a source of the respective transistor is coupled to a common sensing line (CSL) of the memory array.

17. The semiconductor device of claim 12, wherein the second MTJs are electrically coupled in series, wherein internal current flow directions of two adjacent MTJs are the same.

18. A method of forming a semiconductor device, the method comprising:

forming a memory array over a substrate, wherein forming the memory array comprises forming first magnetic tunnel junctions (MTJs) in a first dielectric layer over the substrate;

forming a resistor circuit over the substrate, wherein forming the resistor circuit comprises forming second MTJs in the first dielectric layer and electrically coupling the second MTJs to provide an electrical resistance; and setting a value of the electrical resistance by supplying a pre-determined sequence of electrical currents through the second MTJs.

19. The method of claim 18, wherein the first MTJs and the second MTJs are formed in a same processing step using same materials.

20. The method of claim 18, wherein forming the second MTJs comprises forming the second MTJs in a head-to-tail configuration such that internal current flow directions of the second MTJs are the same.

* * * * *